United States Patent
Ise

(10) Patent No.: US 9,368,728 B2
(45) Date of Patent: Jun. 14, 2016

(54) MATERIAL FOR ORGANIC ELECTROLUMINESCENCE DEVICE, AND ORGANIC ELECTROLUMINESCENCE DEVICE

(75) Inventor: Toshihiro Ise, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 780 days.

(21) Appl. No.: 13/092,487

(22) Filed: Apr. 22, 2011

(65) Prior Publication Data

US 2011/0260604 A1  Oct. 27, 2011

(30) Foreign Application Priority Data

Apr. 23, 2010 (JP) ................. 2010-100397

(51) Int. Cl.
| | |
|---|---|
| *B05D 5/12* | (2006.01) |
| *C07C 211/61* | (2006.01) |
| *H01J 1/63* | (2006.01) |
| *H01L 51/00* | (2006.01) |
| *C09B 57/00* | (2006.01) |
| *C09K 11/06* | (2006.01) |
| *H05B 33/10* | (2006.01) |
| *H01L 51/52* | (2006.01) |

(52) U.S. Cl.
CPC .............. *H01L 51/006* (2013.01); *C09B 57/00* (2013.01); *C09B 57/008* (2013.01); *C09K 11/06* (2013.01); *H01L 51/0001* (2013.01); *H01L 51/0026* (2013.01); *H05B 33/10* (2013.01); *C09K 2211/1007* (2013.01); *C09K 2211/1011* (2013.01); *C09K 2211/1014* (2013.01); *H01L 51/0058* (2013.01); *H01L 51/0067* (2013.01); *H01L 51/0081* (2013.01); *H01L 51/5237* (2013.01); *H01L 51/5246* (2013.01); *H01L 51/5265* (2013.01); *H01L 51/5268* (2013.01)

(58) Field of Classification Search
CPC ...... C09B 57/00; C09B 57/008; C09K 11/06; C09K 2211/1007; C09K 2211/1011; C09K 2211/1014; H01L 51/0058; H01L 51/006; H01L 51/0067; H01L 51/0081; H01L 51/5237; H01L 51/5246; H01L 51/5265; H01L 51/5268; H05B 33/10
See application file for complete search history.

(56) References Cited

U.S. PATENT DOCUMENTS

| 8,022,617 | B2 * | 9/2011 | Iida et al. | 313/504 |
|---|---|---|---|---|
| 2001/0050532 | A1 * | 12/2001 | Eida et al. | 313/504 |
| 2002/0033910 | A1 * | 3/2002 | Ohnishi et al. | 349/69 |

(Continued)

FOREIGN PATENT DOCUMENTS

| JP | 11-224781 A | 8/1999 |
|---|---|---|
| JP | 2001-131541 A | 5/2001 |

(Continued)

OTHER PUBLICATIONS

English translation for JP 2001-329259 A (publication date Nov. 2001).*

*Primary Examiner* — Dawn Garrett
(74) *Attorney, Agent, or Firm* — Riverside law com

(57) ABSTRACT

There is provided a material for an organic electroluminescence device, which is a chrysene skeletal structure-containing diarylamine-based organic material as defined in the specification used for deposition of any layer of at least one organic layer contained in an organic electroluminescence device, wherein the water content ratio before deposition as measured by the Karl Fischer's method is from 100 to 1,000 ppm.

10 Claims, 1 Drawing Sheet

(56) References Cited

U.S. PATENT DOCUMENTS

| | | | |
|---|---|---|---|
| 2005/0082514 A1* | 4/2005 | Yoshimoto et al. | 252/500 |
| 2006/0008673 A1* | 1/2006 | Kwong et al. | 428/690 |
| 2007/0207341 A1* | 9/2007 | Iida et al. | 428/690 |
| 2008/0319239 A1* | 12/2008 | Buesing | 570/147 |
| 2009/0066223 A1* | 3/2009 | Yabe | C09K 11/06 313/504 |
| 2009/0195149 A1* | 8/2009 | Funahashi | 313/504 |
| 2009/0239045 A1* | 9/2009 | Kato et al. | 428/195.1 |
| 2009/0284134 A1* | 11/2009 | Iida et al. | 313/504 |
| 2010/0084676 A1* | 4/2010 | Tanaka | 257/98 |
| 2011/0049497 A1* | 3/2011 | Ise | 257/40 |
| 2012/0169218 A1* | 7/2012 | Takada | C09K 11/06 313/504 |
| 2012/0205635 A1* | 8/2012 | Baba | C07D 209/86 257/40 |

FOREIGN PATENT DOCUMENTS

| | | |
|---|---|---|
| JP | 2001-329259 A * | 11/2001 |
| JP | 2003-313654 A | 11/2003 |
| JP | 2006-66366 A | 3/2006 |
| JP | 2006-210095 A | 8/2006 |
| JP | 2006-256979 A | 9/2006 |
| JP | 2006-278067 A | 10/2006 |
| JP | 2006-294534 A | 10/2006 |
| JP | 2007-87620 A | 4/2007 |
| JP | 2008-192433 A | 8/2008 |
| JP | 2009-102656 A | 5/2009 |
| JP | 2009-146691 A | 7/2009 |
| JP | 2009-252407 A | 10/2009 |
| JP | 2009-540574 A | 11/2009 |
| JP | 2010-56526 A | 3/2010 |
| WO | 01/58221 A1 | 8/2001 |
| WO | 2004/044088 A1 | 5/2004 |
| WO | 2006/082705 A1 | 8/2006 |
| WO | 2006/098080 A1 | 9/2006 |
| WO | 2010/013780 A1 | 2/2010 |
| WO | 2010-032447 A1 | 3/2010 |
| WO | 2010/059837 A2 | 5/2010 |
| WO | WO 2011/024922 A1 * | 2/2011 |

* cited by examiner

MATERIAL FOR ORGANIC ELECTROLUMINESCENCE DEVICE, AND ORGANIC ELECTROLUMINESCENCE DEVICE

This application is based on and claims priority under 35 U.S.C. §119 from Japanese Patent Application No. 2010-100397 filed Apr. 23, 2010, the entire disclosure of which is herein incorporated by reference.

BACKGROUND OF THE INVENTION

1. Field of the Invention

The present invention relates to a material for organic electroluminescence devices and an organic electroluminescence device (hereinafter sometimes referred to as a "device" or an "organic EL"). More specifically, the present invention relates to a technique to reduce the generation ratio of a short-circuit device in the manufacture and increase the manufacturing yield and also relates to a technique to enhance the storage stability of the device.

2. Description of the Related Art

Studies and developments of an organic electroluminescence device are being aggressively made, because high-luminance light emission can be obtained by low-voltage driving. In general, the organic electroluminescence device is composed of a light emitting layer-containing organic layer and a pair of electrodes sandwiching the layer, where an electron injected from a cathode and a hole injected from an anode are recombined in the light emitting layer and the energy of an exciton produced is utilized for luminescence.

For example, International Publication No. 04/044088 describes providing a material for organic EL devices, where an arylamine compound having a chrysene skeletal structure is utilized in the light emitting layer and long-life blue emission with high color purity and high luminous efficiency is thereby obtained, and providing an organic EL device using the material.

High durability capable of withstanding long-term light emission is required of the organic electroluminescence device, but it is well known that intrusion of moisture into the device generates a dark spot and reduces the durability. This is considered to be caused because the water molecule accelerates the chemical decomposition of a material or accelerates the separation at the organic layer-electrode interface.

In this respect, various measures to prevent reduction in the durability due to invasion of moisture are being taken and, for example, dehydration after wet deposition to reduce the water content ratio in a thin film (see, for example, International Publication No. 01/058221), an encapsulated structure to prevent invasion of moisture (see, for example, JP-A-2007-87620 (the term "JP-A" as used herein means an "unexamined published Japanese patent application"), JP-A-2006-294534 and JP-A-2006-278067), and use of an absorbent material, a moisture scavenger or the like (see, for example, JP-A-2006-66366 and JP-A-2006-210095) have been disclosed. Also, a technique of performing a heat treatment in vacuum during deposition to remove water is disclosed (see, for example, JP-A-2003-313654).

Furthermore, it is disclosed that in forming a layer by a wet deposition method, water contained in the composition for an organic electroluminescence device is minimized, whereby water is not allowed to remain in the film after drying and deterioration of the characteristics of a device is suppressed (see, for example, JP-A-2009-102656).

On the other hand, as is well known, fine dust contamination of a device causes electrical short-circuit (short) of the device and reduces the yield in the manufacture. As for the method to prevent short due to fine dust contamination, it has been proposed to provide a flattening layer between an anode layer and an organic layer (see, for example, JP-A-11-224781). However, this method cannot prevent a device from defect generation ascribable to fine dust in an organic layer.

Also, a technique of setting the relative humidity to 0.01 ppm or more at the deposition by a wet deposition method and thereby suppressing electrostatic generation during deposition is disclosed (see, for example, JP-A-2009-146691).

Furthermore, it is disclosed that when the relative humidity in a processing step before vapor deposition is set to 0.01 ppm or more, control to keep the environment constant is facilitated and a device can be stably manufactured (see, for example, JP-A-2008-192433).

SUMMARY OF THE INVENTION

An object of the present invention is to provide a material for organic electroluminescence devices, which enables manufacturing an organic electroluminescence device imparted with excellent luminescence characteristics, reduced in the number of shorted devices and excelled also in the storage stability, and an organic electroluminescence device using the material for organic electroluminescence devices.

Another object of the present invention is to provide a composition and a light emitting layer, which are useful for an organic electroluminescence device. Still another object of the present invention is to provide a light emission apparatus, a display apparatus and an illumination apparatus each containing the organic electroluminescence device.

As described, for example, in International Publication No. 01/058221 and JP-A-2009-102656, it is known that even slight moisture intrusion is undesirable for device durability. In light of common sense, the embodiment of the present invention using a material represented by the later-described formula (I) for organic electroluminescence devices, which contains water in an amount in a specific range, cannot be expected to have an effect in enhancing the manufacture or characteristics of a device.

However, as a result of intensive studies, the present inventors have found that when a material represented by formula (I) for organic electroluminescence devices, which is an organic material used for deposition of any layer of at least one organic layer contained in an organic electroluminescence device and in which the water content ratio before deposition (that is, in a solid state) as measured by the Karl Fischer's method is from 100 to 1,000 ppm, is used, it is ensured that in an organic electroluminescence device containing a layer obtained by depositing the material, the probability of generation of a shorted device can be reduced without deteriorating the driving durability and the yield can be enhanced. Incidentally, the water content ratio above is a water content ratio in a solid state before deposition. Also, the configuration above is at the same time effective in suppressing white clouding of a device during storage of the device. The mechanisms of these effects are not yet understood, but it is presumed that electrification is suppressed by the adsorbed water on the solid surface and fine dust attachment due to static electricity is reduced. As a result, fine dust intrusion into a device can be prevented, and this is considered to produce an effect in reducing the number of shorted devices or enhancing the storage stability of the device.

Incidentally, in the material for organic EL devices, synthesized by the method described in International Publication No. 04/044088, the water content ratio is less than 5 ppm.

That is, the present invention is attained by the following techniques.

[1] A material represented by the following formula (I) for an organic electroluminescence device, which is an organic material used for deposition of any layer of at least one organic layer contained in an organic electroluminescence device, wherein a water content ratio before deposition as measured by the Karl Fischer's method is from 100 to 1,000 ppm:

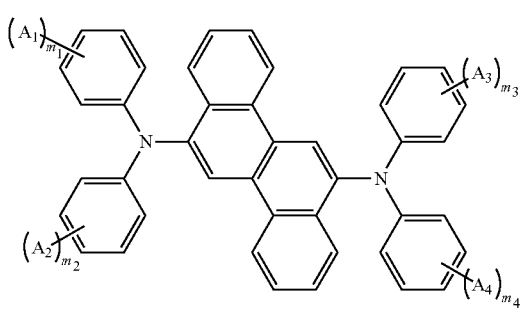

(I)

wherein each of $A_1$ to $A_4$ independently represents an alkyl group, a cycloalkyl group, an aryl group, a heteroaryl group, a cyano group, a fluorine atom, an alkoxy group, a phenoxy group or an amino group; and each of $m_1$ to $m_4$ independently represents an integer of 0 to 5, and when $m_1$ to $m_4$ is 2 or more, a plurality of $A_1$'s, a plurality of $A_2$'s, a plurality of $A_3$'s and a plurality of $A_4$'s may be the same as or different respectively, and a plurality of $A_1$'s, a plurality of $A_2$'s, a plurality of $A_3$'s and a plurality of $A_4$'s may combine with each other to form a ring respectively.

[2] The material for an organic electroluminescence device as described in [1] above, wherein each of $A_1$ to $A_4$ independently represents a methyl group, an ethyl group, an n-propyl group, an isopropyl group, an n-butyl group, an isobutyl group, a sec-butyl group, a tert-butyl group or a neopentyl group.

[3] The material for an organic electroluminescence device as described in [1] or [2] above, wherein each of $m_1$ to $m_4$ is 1.

[4] The material for an organic electroluminescence device as described in any one of [1] to [3] above, wherein each of $A_1$ to $A_4$ is independently a methyl group or an isopropyl group.

[5] The material for an organic electroluminescence device as described in any one of [1] to [4] above, wherein the material represented by formula (I) for an organic electroluminescence device is the following compound.

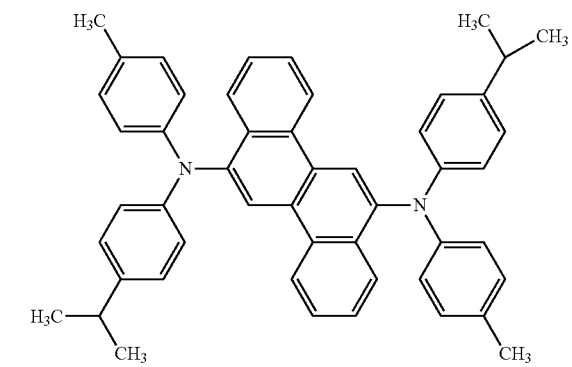 [SMILES: Cc1ccc(N(c2ccc(C(C)C)cc2)c2cc3c4ccccc4c(N(c4ccc(C)cc4)c4ccc(C(C)C)cc4)cc3c3ccccc23)cc1]

[6] A light emitting layer, which is formed using the material for an organic electroluminescence device as described in any one of [1] to [5] above.

[7] A composition, comprising:
the material for an organic electroluminescence device as described in any one of [1] to [5] above.

[8] An organic electroluminescence device, comprising:
a substrate having thereon a pair of electrodes and at least one organic layer containing a light emitting layer and being disposed between the pair of electrodes,
wherein any layer of the at least one organic layer is a layer formed using the material for an organic electroluminescence device as described in any one of [1] to [5] above.

[9] A method for manufacturing an organic electroluminescence device, comprising:
using the material for an organic electroluminescence device as described in any one of [1] to [5] above.

[10] A method for reducing generation ratio of a shorted device, comprising:
using the material for an organic electroluminescence device as described in any one of [1] to [5] above.

[11] A light emission apparatus, comprising:
the organic electroluminescence device as described in [8] above.

[12] A display apparatus, comprising:
the organic electroluminescence device as described in [8] above.

[13] An illumination apparatus, comprising:
the organic electroluminescence device as described in [8] above.

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE INVENTION

Figure 1:
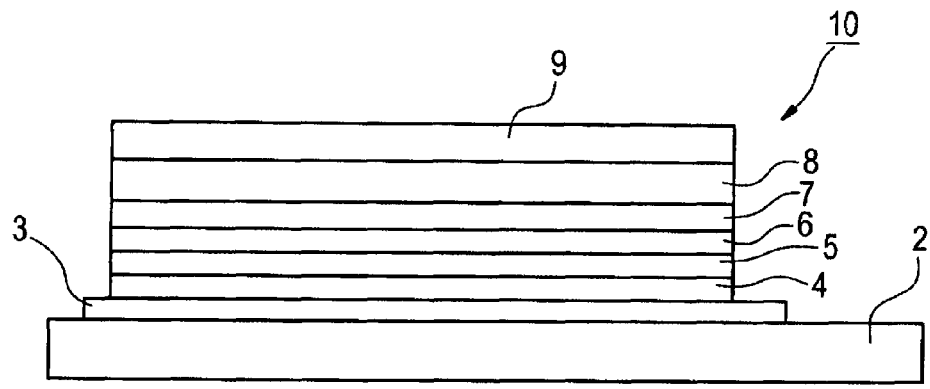
FIG. 1 is a schematic view showing one exemplary example of the layer configuration of the organic electroluminescence device according to the present invention.

In the present invention, the substituent Z is defined as follows.

(Substituent Z)

An alkyl group (preferably having a carbon number of 1 to 10, more preferably from 1 to 6, still more preferably from 1 to 4, e.g., methyl, ethyl, isopropyl, n-propyl, tert-butyl, isobutyl, n-butyl, neopentyl, n-pentyl, n-hexyl, cyclopropyl, cyclopentyl, cyclohexyl), an alkenyl group (preferably having a carbon number of 2 to 8, more preferably from 2 to 5, e.g., vinyl), an aryl group (preferably having a carbon number of 6 to 30, more preferably from 6 to 20, e.g., phenyl, naphthyl, anthryl, tetracenyl, pyrenyl, perylenyl, triphenylenyl, chrysenyl), a heteroaryl group (preferably having a carbon number of 4 to 30, more preferably from 4 to 20, e.g., pyridine, pyrazine, pyrimidine, pyridazine, triazine, thiophene, furan, oxazole, thiazole, imidazole, pyrazole, triazole, oxadiazole, thiadiazole), an alkoxy group (preferably having a carbon number of 1 to 8, more preferably from 1 to 5, e.g., methoxy, ethoxy, n-propyloxy, iso-propyloxy), a phenoxy group, a fluorine atom, a silyl group (preferably having a carbon number of 4 to 30, more preferably from 4 to 20, e.g., trimethylsilyl, triethylsilyl, triphenylsilyl), an amino group (preferably having a carbon number of 2 to 60, more preferably from 2 to 40, e.g., dimethylamino, diethylamino, diphenylamino), a cyano group, and a group formed by combining these. A plurality of substituents Z may combine with each other to form an aryl ring. Examples of the aryl ring formed by combining a plurality of substituents Z with each other include a phenyl ring and a pyridine ring, with a phenyl group being preferred.

The material represented by formula (I) for organic electroluminescence devices of the present invention is a material for organic electroluminescence devices, which is an organic material used for deposition of any layer of at least one organic layer contained in an organic electroluminescence device, wherein the water content ratio determined by heating and vaporizing a sample (organic material) before deposition, in other words, a sample (organic material) in a solid state before dry deposition such as vapor deposition or wet deposition by a transfer method, a printing method or the like, and measuring the water content by the Karl Fischer's method is from 100 to 1,000 ppm (that is, the water amount in 1 kg of a sample (organic material) before deposition is from 100 to 1,000 mg). Also, the organic electroluminescence device of the present invention comprises a substrate having thereon a pair of electrodes and at least one organic layer containing at least one light emitting layer and being disposed between the electrodes.

In the present specification, when merely referred to as a "water content ratio", this means a water content ratio as measured by the Karl Fischer's method.

An organic electroluminescence device is manufactured using a material having a water content ratio in the range above, whereby the probability of generation of a shorted device can be reduced without deteriorating the durability and the yield can be increased. Also, crystallization of the device material can be suppressed and the storage stability of the device can be enhanced. This is considered to be attained thanks to the fact that by virtue of containing a small amount of water, dust collection due to electrification of the material can be prevented, a device manufactured using the material can be also prevented from fine dust contamination, and crystal growth using a fine dust as the core can be inhibited.

The material for organic electroluminescence devices of the present invention is preferably used for the deposition of a light emitting layer and more preferably used as a light emitting material for the deposition of a light emitting layer.

In the present invention, the material for organic electroluminescence devices of the present invention where the water content ratio before deposition as measured by the Karl Fischer's method is from 100 to 1,000 ppm, is a diarylamine compound containing a chrysene skeletal structure and having a water amount corresponding to the water content ratio in the range above, and this is specifically a material represented by the following formula (I) for organic electroluminescence devices.

Incidentally, the term "the material for organic electroluminescence devices of the present invention" or "a material represented by the following formula (I) for organic electroluminescence devices" as used in the present specification means a compound represented by formula (I) having a water amount corresponding to the water content ratio in the range above. Also, the term "a compound represented by formula (I)" means the compound itself, that is, a compound where the water amount corresponding to the water content ratio in the range above is substantially removed from the "material represented by the following formula (I) for organic electroluminescence devices" (more specifically, a compound where the water content ratio of the material represented by formula (I) for organic electroluminescence devices is preferably less than 5 ppm, ideally 0 ppm, that is, water is not contained).

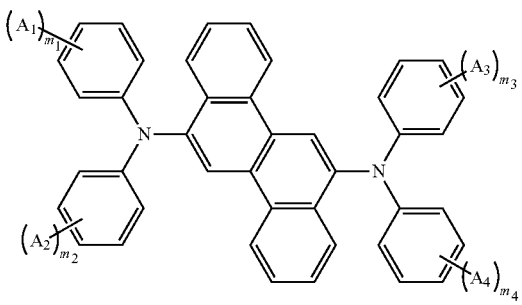

(I)

In formula (I), each of $A_1$ to $A_4$ independently represents an alkyl group, a cycloalkyl group, an aryl group, a heteroaryl group, a cyano group, a fluorine atom, an alkoxy group, a phenoxy group or an amino group.

Each of $m_1$ to $m_4$ independently represents an integer of 0 to 5, and when each of $m_1$ to $m_4$ is 2 or more, $A_1$, $A_2$, $A_3$ or $A_4$ may be the same as or different from every other $A_1$, $A_2$, $A_3$ or $A_4$ and $A_1$'s, $A_2$'s, $A_3$'s or $A_4$'s may combine with each other to form a ring.

The alkyl group represented by $A_1$ to $A_4$ may have a substituent and may be saturated or unsaturated. In the case of having a substituent, the substituent includes the above-described substituent Z, and the substituent Z is preferably a fluorine atom. The alkyl group represented by $A_1$ to $A_4$ is preferably an alkyl group having a carbon number of 1 to 8, more preferably an alkyl group having a carbon number of 1 to 6, still more preferably an alkyl group having a carbon number of 1 to 4. Examples thereof include a methyl group, a trifluoromethyl group, an ethyl group, an n-propyl group, an isopropyl group, an n-butyl group, an isobutyl group, a sec-butyl group, a tert-butyl group, an n-pentyl group, an isopentyl group, a 2-methylpentyl group, a neopentyl group, an n-hexyl group, a 4-methylpentyl group, a 3-methylpentyl group, a 3,3-dimethylbutyl group, a 2,2-dimethylbutyl group, a 1,1-dimethylbutyl group, a 1,2-dimethylbutyl group, a 1,3- dimethylbutyl group, and a 2,3-dimethylbutyl group. Among these, a methyl group, an ethyl group, an n-propyl group, an isopropyl group, a n-butyl group, an isobutyl group, a sec-butyl group, a tert-butyl group and a neopentyl group are preferred, and a methyl group and an isopropyl group are more preferred.

The cycloalkyl group represented by $A_1$ to $A_4$ may have a substituent and may be saturated or unsaturated. In the case of having a substituent, the substituent includes the above-described substituent Z, and the substituent Z is preferably an alkyl group. The cycloalkyl group represented by $A_1$ to $A_4$ is preferably a cycloalkyl group having a carbon number of 3 to 10, more preferably a cycloalkyl group having a carbon number of 5 to 10, still more preferably a cyclopentyl group or a cyclohexyl group.

The aryl group represented by $A_1$ to $A_4$ may be ring-fused and may have a substituent. In the case of having a substituent, the substituent includes the above-described substituent Z, and the substituent Z is preferably an alkyl group or an aryl group, more preferably an alkyl group. The aryl group represented by $A_1$ to $A_4$ is preferably an aryl group having a carbon number of 6 to 30, more preferably an aryl group having a carbon number of 6 to 18. The aryl group having a carbon number of 6 to 18 is preferably an aryl group having a carbon number of 6 to 18, which may have an alkyl group having a carbon number of 1 to 6, and more preferably an aryl group having a carbon number of 6 to 18, which may have an alkyl group having a carbon number of 1 to 4. Examples thereof include a phenyl group, a methylphenyl group, a dimethylphenyl group, a biphenyl group, a terphenyl group, a naphthyl group, a methylnaphthyl group, a tert-butylnaphthyl group, an anthryl group, a phenanthryl group and a chrysenyl group. Among these, a phenyl group, a methylphenyl group and a biphenyl group are preferred, and a phenyl group is more preferred.

The heteroaryl group represented by $A_1$ to $A_4$ may be ring-fused and may have a substituent. In the case of having a substituent, the substituent includes the above-described substituent Z, and the substituent Z is preferably an alkyl group or an aryl group, more preferably an alkyl group. The heteroaryl group represented by $A_1$ to $A_4$ is preferably a heteroaryl group having a carbon number of 4 to 12, more preferably a heteroaryl group having a carbon number of 4 to 10. Examples thereof include a pyridyl group and a furyl group, with a pyridyl group being preferred.

The alkoxy group represented by $A_1$ to $A_4$ may have a substituent and may be saturated or unsaturated. In the case of having a substituent, the substituent includes the above-described substituent Z, and the substituent Z is preferably a fluorine atom, an alkyl group or an aryl group. The alkoxy group represented by $A_1$ to $A_4$ is preferably an alkoxy group having a carbon number of 1 to 10, more preferably an alkoxy group having a carbon number of 1 to 6, still more preferably a methoxy group.

The phenoxy group represented by $A_1$ to $A_4$ may have a substituent. In the case of having a substituent, the substituent includes the above-described substituent Z, and the substituent Z is preferably a fluorine atom, an alkyl group or an aryl group. The phenoxy group represented by $A_1$ to $A_4$ is preferably an unsubstituted phenoxy group.

The amino group represented by $A_1$ to $A_4$ may have a substituent. In the case of having a substituent, the substituent includes the above-described substituent Z, and the substituent Z is preferably an alkyl group or an aryl group, more preferably an alkyl group. The amino group represented by $A_1$ to $A_4$ is preferably an unsubstituted amino group, a dialkylamino group or a diarylamino group, each having a carbon number of 0 to 24, more preferably a dialkylamino group or a diarylamino group, each having a carbon number of 2 to 12. Examples thereof include a dimethylamino group, a diethylamino group, a diphenylamino group, and a dinaphthylamino group, with a dimethylamino group and a diphenylamino group being preferred.

When each of $m_1$ to $m_4$ is 2 or more, the ring which may be formed by combining a plurality of $A_1$'s, a plurality of $A_2$'s, a plurality of $A_3$'s, or a plurality of $A_4$'s with each other includes a 5- or 6-membered ring, and a benzene ring is preferably formed.

Each of $A_1$ to $A_4$ independently represents preferably an alkyl group, more preferably a methyl group, an ethyl group, an n-propyl group, an isopropyl group, an n-butyl group, an isobutyl group, a sec-butyl group, a tert-butyl group or a neopentyl group, still more preferably a methyl group or an isopropyl group.

Each of $m_1$ to $m_4$ independently represents an integer of 0 to 5 and is preferably an integer of 0 to 2, more preferably 0 or 1, still more preferably 1.

When each of $m_1$ to $m_4$ is 1, each of $A_1$ to $A_4$ is preferably substituted on the 4-position of the benzene ring from the standpoint that the reaction-active position is blocked with a substituent and the reaction giving rise to device deterioration can be suppressed.

Examples of the compound which is used as the material represented by formula (I) for organic electroluminescence devices of the present invention include Compounds 1 to 34 illustrated below, but the present invention is not limited thereto.

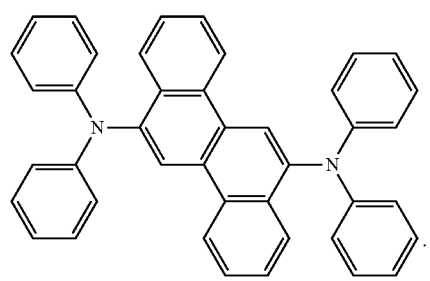

1

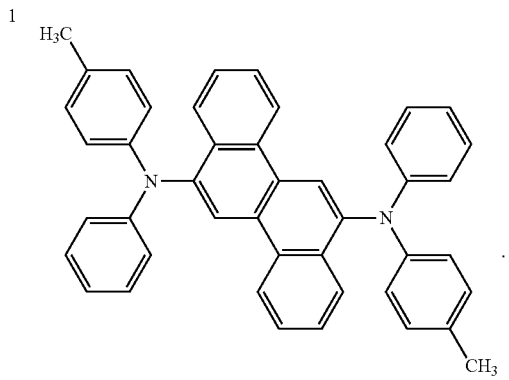

2

-continued
3
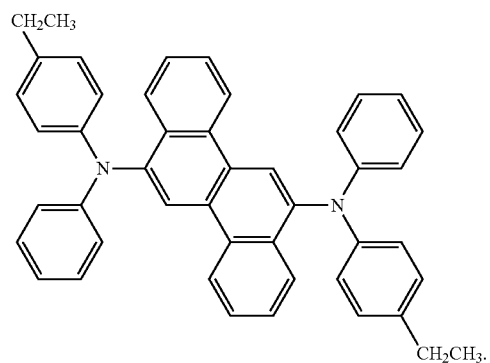
4
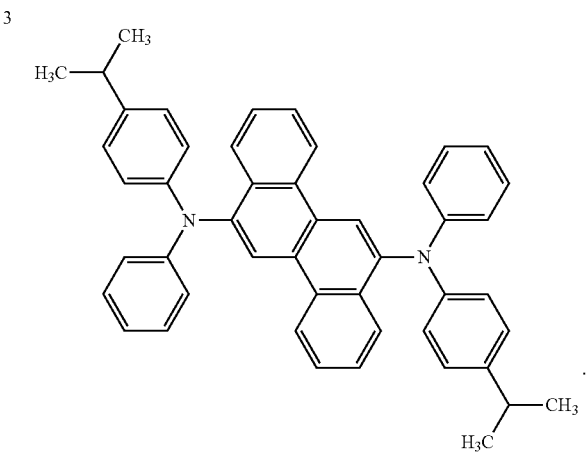
5
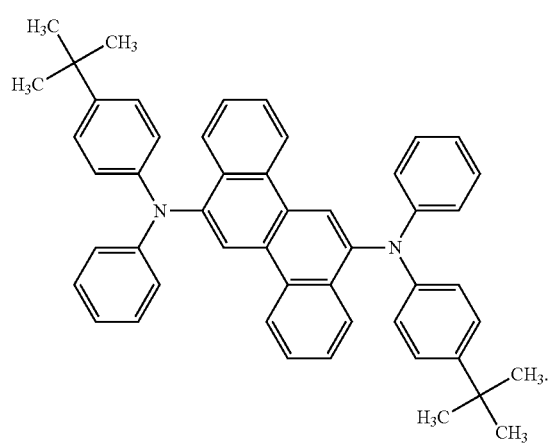
6
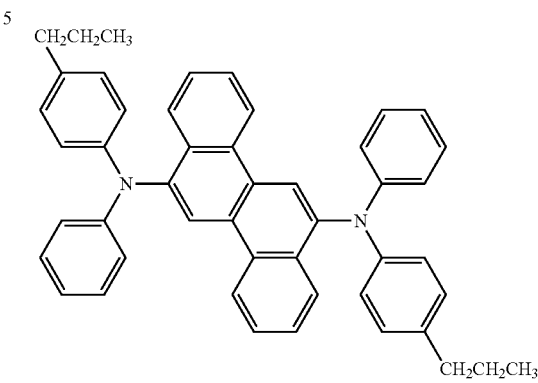
7
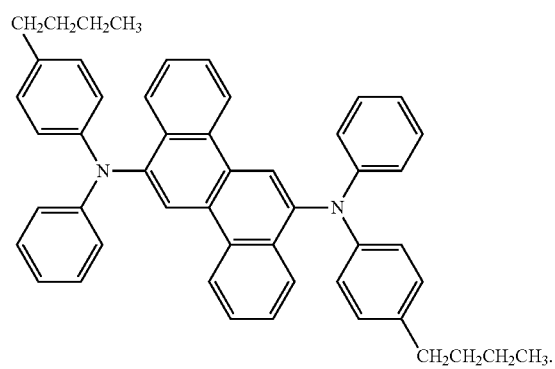
8
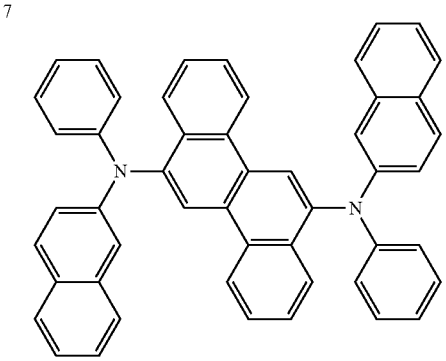
9
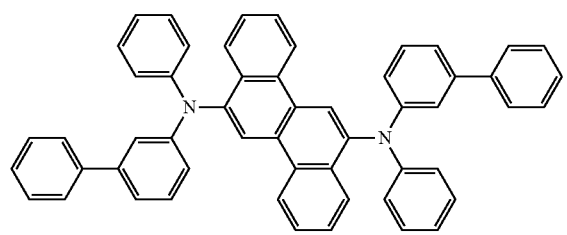
10
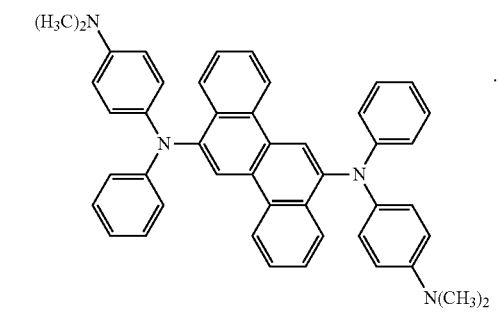

-continued
11
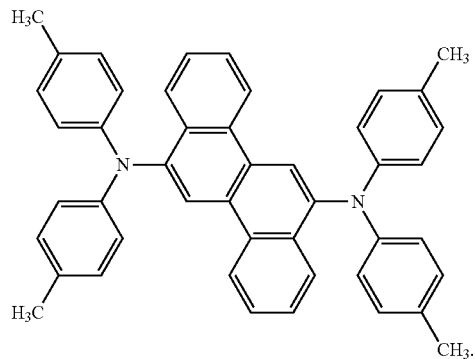
12
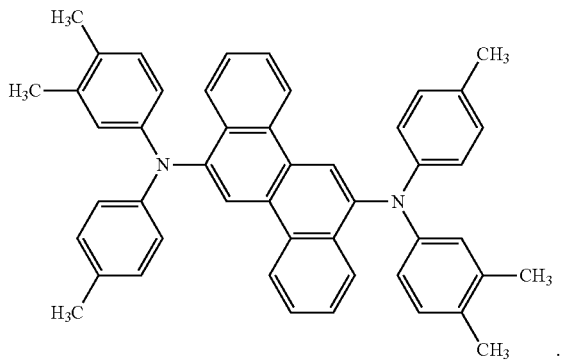
13
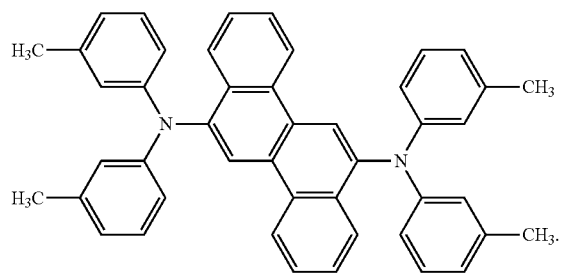
14
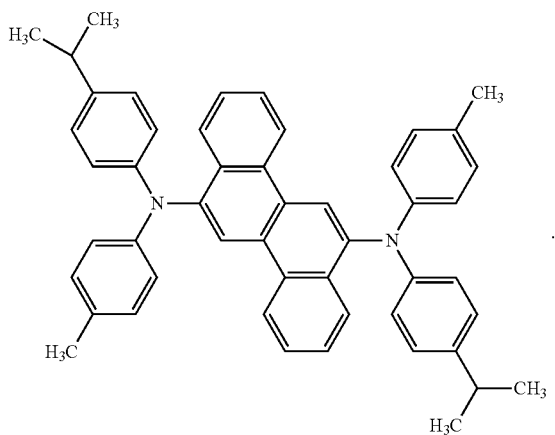
15
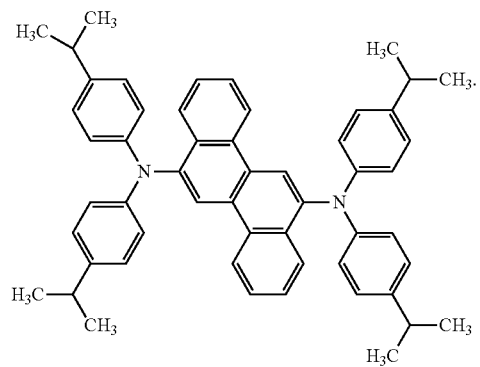
16
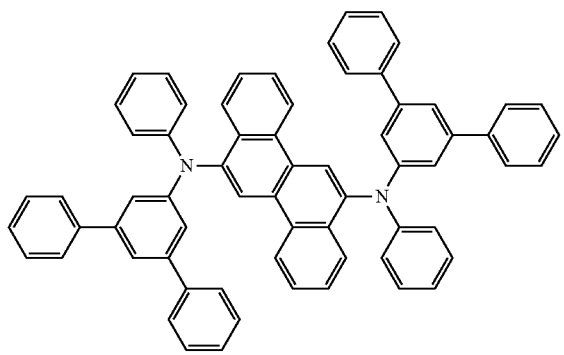
17
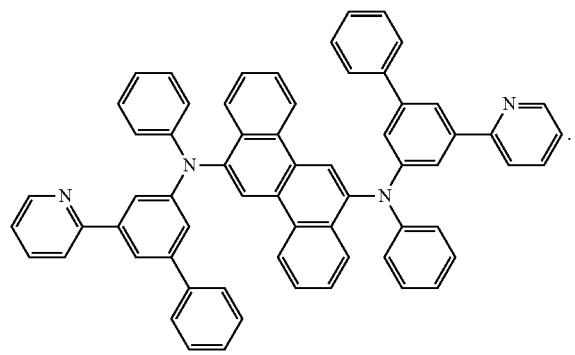
18
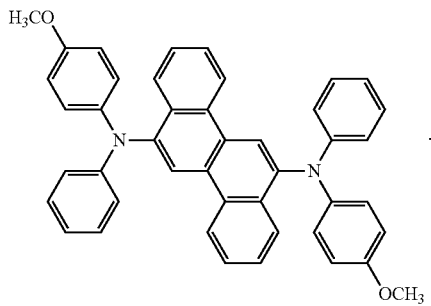

-continued
19
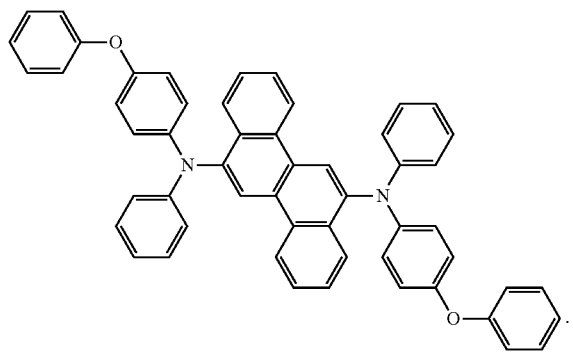
20
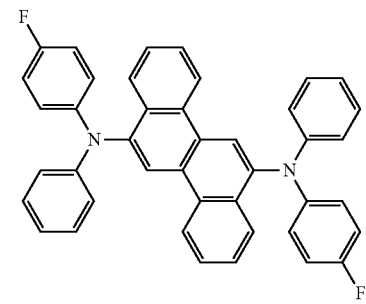
21
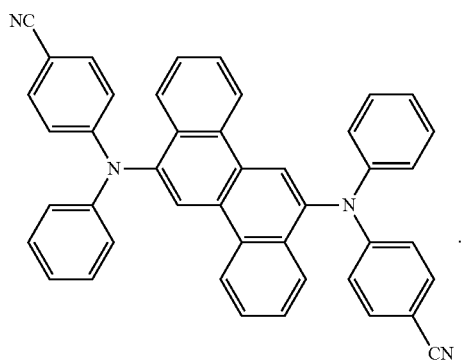
22
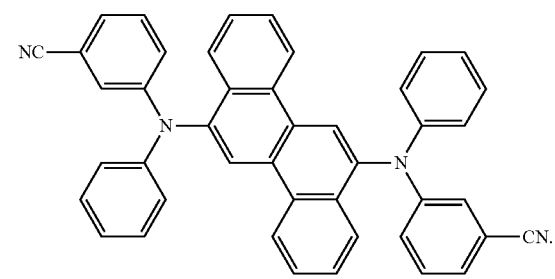
23
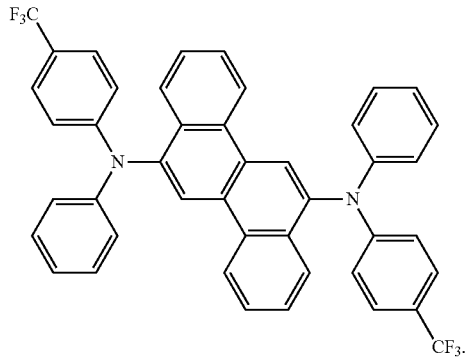
24
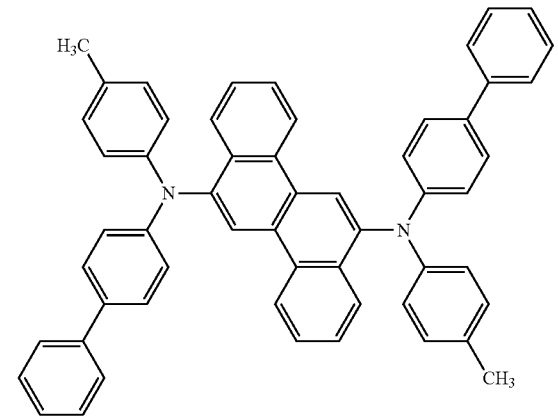
25
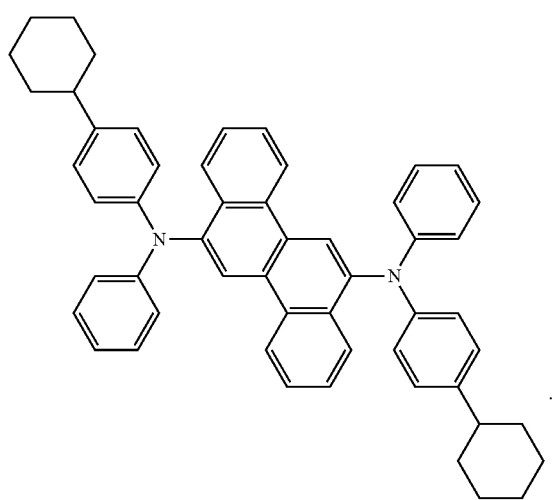
26
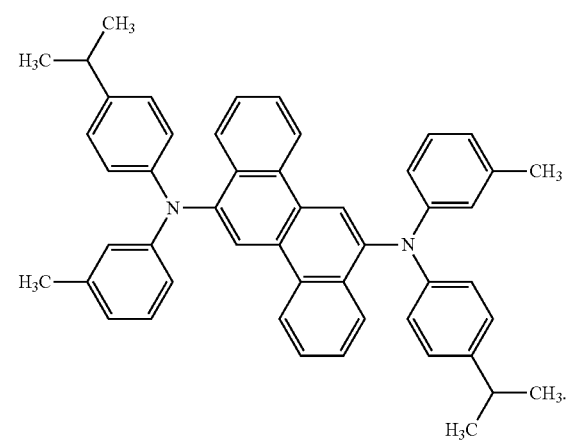

-continued
27
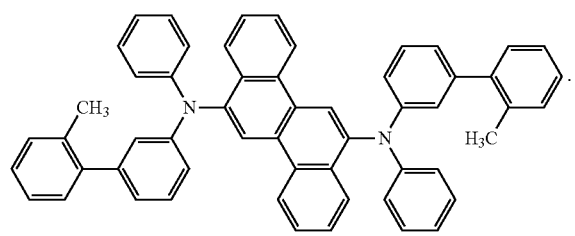
28
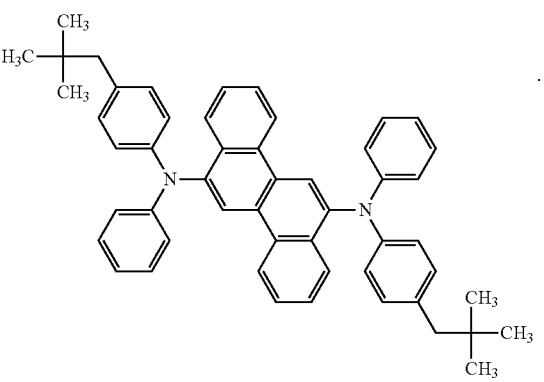
29
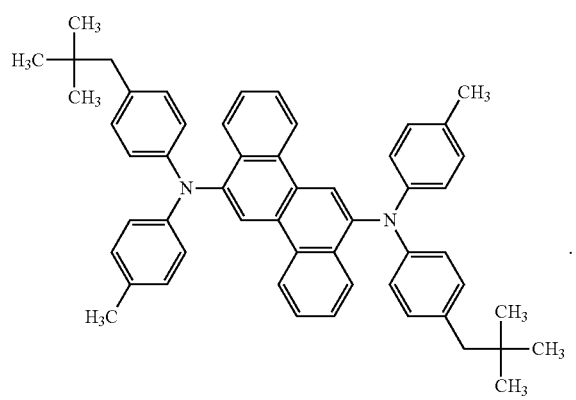
30
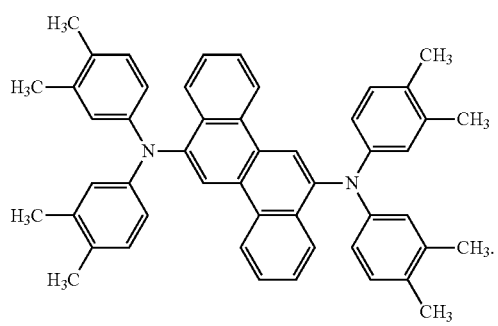
31
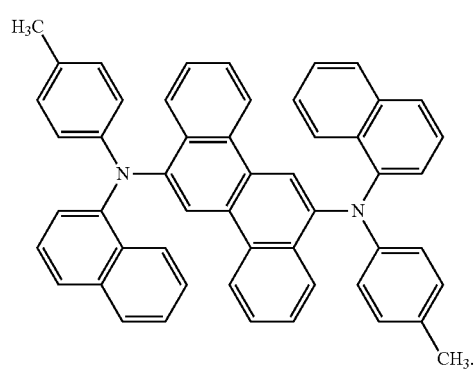
32
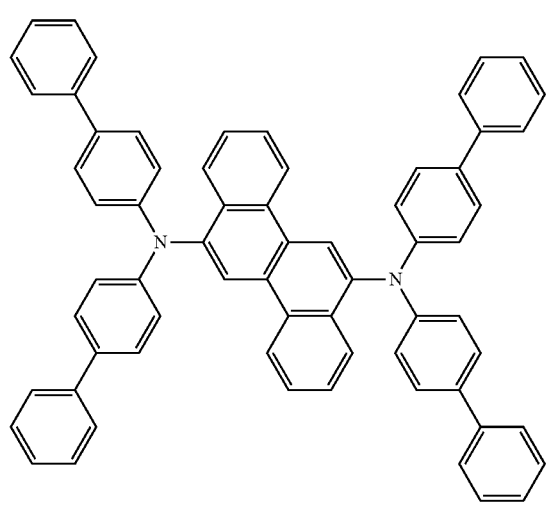

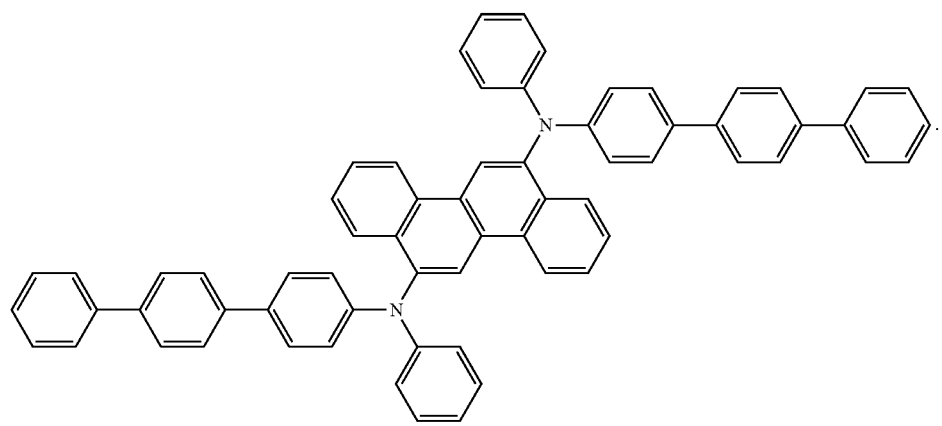

33

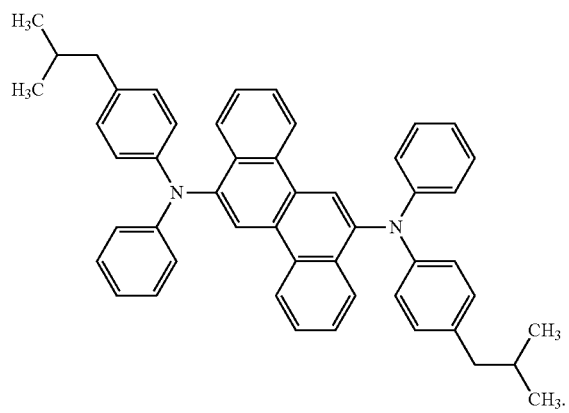

34

As the material represented by formula (I) for organic electroluminescence devices, Compound 14 is preferably used.

The compounds illustrated above can be synthesized by the same method as the method described in International Publication No. 04/044088, pp. 18-22. For example, Compound 14 can be synthesized by the method of Synthesis Example 8 described in International Publication No. 04/044088, page 21.

The material for organic electroluminescence devices of the present invention can be used for the manufacture of an organic electroluminescence device. At least one organic layer (preferably a light emitting layer) in the organic electroluminescence device of the present invention is preferably deposited by further using at least one host material in addition to the material for organic electroluminescence devices of the present invention. The host material may be a hole-transporting host material or an electron-transporting host material but is preferably a both charges-transporting host material. These host materials include the later-described host materials.

In the case where the light emitting layer for use in the present invention is formed using the material for organic electroluminescence devices of the present invention, the content of the compound (that is, the compound represented by formula (I)) used as the material for organic electroluminescence devices of the present invention, in the light emitting layer, is preferably from 0.01 to 25 mass %, more preferably from 0.1 to 10 mass %, and most preferably from 0.1 to 5 mass %. (In this specification, mass ratio is equal to weight ratio.)

[Composition Using the Material for Organic Electroluminescence Devices where the Water Content Ratio Before Deposition is from 100 to 1,000 Ppm]

The present invention also relates to a composition using the material for organic electroluminescence devices where the water content ratio before deposition is from 100 to 1,000 ppm.

In the composition of the present invention, the content of the material for organic electroluminescence devices where the water content ratio before deposition is from 100 to 1,000 ppm, is preferably from 0.01 to 25 mass %, more preferably from 0.1 to 10 mass %, and most preferably from 0.1 to 5 mass %.

Other components which may be contained in the composition of the present invention may be an organic material or an inorganic material. As for the organic material, the later-described host material can be preferably applied.

The content of the host material contained in the composition of the present invention is preferably from 75 to 99.99 mass %, more preferably from 90 to 99.9 mass %, still more preferably from 95 to 99.9 mass %.

The composition of the present invention can form an organic layer of an organic electroluminescence device by a dry deposition method such as vapor deposition method and sputtering method or a wet deposition method such as transfer method and printing method, and preferably forms an organic layer by a dry deposition method, more preferably forms an organic layer by a vapor deposition method.

[Organic Electroluminescence Device]

The device of the present invention is described in detail below.

The organic electroluminescence device of the present invention is an organic electroluminescence device comprising a substrate having thereon a pair of electrodes and at least one organic layer containing a light emitting layer and being disposed between the electrodes, and in this organic electroluminescence device, any layer of the at least one organic layer is a layer formed using the material for organic electroluminescence devices, where the water content ratio before deposition is from 100 to 1,000 ppm. That is, the material for organic electroluminescence devices of the present invention, where the water content ratio before deposition is from 100 to 1,000 ppm, is used for the deposition of any layer of the at least one organic layer in the organic electroluminescence device of the present invention.

In the organic electroluminescence device of the present invention, the layer formed using the material for organic electroluminescence devices of the present invention, where the water content ratio before deposition is from 100 to 1,000 ppm, is an organic layer, preferably a light emitting layer, and the device may have a plurality of organic layers.

In view of property of the luminescence device, at least either one electrode out of an anode and a cathode is preferably transparent or semi-transparent.

FIG. 1 shows one exemplary example of the configuration of the organic electroluminescence device of the present invention. In the organic electroluminescence device 10 of FIG. 1, an organic layer containing a light emitting layer 6 is sandwiched between a pair of electrodes (an anode 3 and a cathode 9) on a substrate 2. As for the organic layer, a hole injection layer 4, a hole transport layer 5, a light emitting layer 6, a hole blocking layer 7 and an electron transport layer 8 are stacked in this order from the anode 3 side.

<Configuration of Organic Layer>

The layer configuration of the organic layer is not particularly limited and may be appropriately selected according to the use and purpose of the organic electroluminescence device but is preferably formed on the transparent electrode or the back plate. In this case, the organic layer is formed on the front surface or one surface of the transparent electrode or the back plate.

The shape, size, thickness and the like of the organic layer are not particularly limited and may be appropriately selected according to the purpose.

Specific examples of the layer configuration include the following configurations, but the present invention is not limited thereto.

Anode/hole transport layer/light emitting layer/electron transport layer/cathode Anode/hole transport layer/light emitting layer/second electron transport layer (hole blocking layer)/first electron transport layer/cathode Anode/hole transport layer/light emitting layer/second electron transport layer (hole blocking layer)/first electron transport layer/electron injection layer/cathode Anode/hole injection layer/hole transport layer/light emitting layer/second electron transport layer (hole blocking layer)/first electron transport layer/cathode Anode/hole injection layer/hole transport layer/light emitting layer/second electron transport layer (hole blocking layer)/first electron transport layer/electron injection layer/cathode Anode/hole injection layer/first hole transport layer/second hole transport layer (electron blocking layer)/light emitting layer/second electron transport layer (hole blocking layer)/first electron transport layer/electron injection layer/cathode The device configuration, substrate, cathode and anode of the organic electroluminescence device are described in detail, for example, in JP-A-2008-270736, and the matters described therein can be applied to the present invention.

<Substrate>

The substrate for use in the present invention is preferably a substrate which does not scatter or attenuate the light emitted from the organic layer. In the case of an organic material, a material excellent in the heat resistance, dimensional stability, solvent resistance, electric insulation and processability is preferred.

<Anode>

The anode is usually sufficient if it has a function as an electrode of supplying a hole to the organic layer. The shape, structure, size and the like thereof are not particularly limited, and the anode material may be appropriately selected from known electrode materials according to the use or purpose of the luminescence device. As described above, the anode is usually provided as a transparent anode.

<Cathode>

The cathode is usually sufficient if it has a function as an electrode of injecting an electron in the organic layer. The shape, structure, size and the like thereof are not particularly limited, and the cathode material may be appropriately selected from known electrode materials according to the use or purpose of the luminescence device.

As for the substrate, anode and cathode, the matters described in JP-A-2008-270736, paragraphs [0070] to [0089] can be applied to the present invention.

<Organic Layer>

The organic layer for use in the present invention is described below.

(Formation of Organic Layer)

In the organic electroluminescence device of the present invention, each organic layer may be suitably formed by either a dry deposition method such as vapor deposition method and sputtering method, or a wet deposition method such as transfer method and printing method. Forming an organic layer by a dry deposition method is preferred, and forming an organic layer by a vapor deposition method is more preferred.

(Light Emitting Layer)

—Light Emitting Material—

The light emitting layer is preferably formed using at least one light emitting material.

As for the light emitting material used in the present invention, the material represented by formula (I) for organic electroluminescence devices, where the water content ratio before deposition is from 100 to 1,000 ppm, is preferably used, and it is more preferred to use Compound 14 as the material for organic electroluminescence devices of the present invention. By virtue of using the material for organic electroluminescence devices, where the water content ratio before deposition is from 100 to 1,000 ppm, the material can be prevented from fine dust contamination due to electrification and in turn, fine dust contamination of the device can be prevented, as a result, the generation ratio of a shorted device can be reduced and the yield of the organic electroluminescence device can be increased. Also, white clouding of the device can be suppressed, and the storage stability of the device can be enhanced.

The content of the compound used as the light emitting material, in the light emitting layer, is preferably from 0.01 to 25 mass %, more preferably from 0.1 to 10 mass %, and most preferably from 0.1 to 5 mass %, based on the mass of all compounds forming the light emitting layer.

The thickness of the light emitting layer is not particularly limited but usually, the thickness is preferably from 2 to 500 inn and in view of external quantum efficiency, more preferably from 3 to 200 nm, still more preferably from 5 to 100 nm.

—Host Material—

In the device of the present invention, the light emitting layer may be composed of only a light emitting material or may have a mixed layer configuration of a host material and a light emitting material. The host material is preferably a charge transport material. As for the host material, one kind of a host material or two or more kinds of host materials may be used, and examples of this case include a configuration where an electron-transporting host material and a hole-transporting host material are mixed. Also, the light emitting layer may contain a material having no electron transport property and being incapable of emitting light. Examples of the host material for use in the present invention include pyrrole, indole, carbazole, CBP (4,4'-di(9-carbazoyl)biphenyl)), azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, an aromatic tertiary amine compound, a styrylamine compound, a porphyrin-based compound, a polysilane-based compound, poly(N-vinylcarbazole), an aniline-base copolymer, an electrically conductive polymer oligomer such as thiophene oligomer and polythiophene, an organic silane, a carbon film, pyridine, pyrimidine, triazine, imidazole, pyrazole, triazole, oxazole, oxadiazole, fluorenone, anthraquinodimethane, anthrone, diphenylquinone, thiopyran dioxide, carbodiimide, fluorenylidenemethane, distyrylpyrazine, a fluorine-substituted aromatic compound, a condensed polycyclic (such as naphthalene, perylene) tetracarboxylic anhydride, various metal complexes typified by a metal complex of 8-quinolinol derivative and a metal complex having metal phthalocyanine, benzoxazole or benzothiazole as the ligand, and derivatives thereof (may have a substituent or a condensed ring).

In the light emitting layer for use in the present invention, in view of luminous efficiency and driving durability, the lowest singlet excitation energy ($S_1$ energy) of the host material is preferably higher than the $S_1$ energy of the light emitting material.

In the present invention, the content of the host compound is not particularly limited but in view of luminous efficiency and drive voltage, the host compound is preferably contained in an amount of 75 to 99.99 mass %, more preferably from 90 to 99.9 mass %, still more preferably from 95 to 99.9 mass %, based on the mass of all compounds forming the light emitting layer.

The light emitting layer in the device of the present invention is preferably a layer formed using the above-described host material and, as a light emitting material, the material represented by formula (I) for organic electroluminescence devices, where the water content ratio before deposition is from 100 to 1,000 ppm.

Also, the light emitting layer may be a single layer or a multilayer composed of two or more layers. In the case where the light emitting layer is composed of a plurality of layers, the material represented by formula (I) for organic electroluminescence devices, where the water content ratio before deposition is from 100 to 1,000 ppm, may be contained in two or more light emitting layers.

—Hole Injection Layer, Hole Transport Layer—

The hole injection layer and hole transport layer are a layer having a function of receiving a hole from the anode or anode side and transporting it to the cathode side.

—Electron Injection Layer, Electron Transport Layer—

The electron injection layer and electron transport layer are a layer having a function of receiving an electron from the cathode or cathode side and transporting it to the anode side.

As regards the hole injection layer, hole transport layer, electron injection layer and electron transport layer, the matters described in JP-A-2008-270736, paragraphs [0165] to [0167] can be applied to the present invention.

—Hole Blocking Layer—

The hole blocking layer is a layer having a function of not allowing a hole transported to the light emitting layer from the anode side to penetrate to the cathode side. In the present invention, the hole blocking layer may be provided as an organic compound layer adjacent to the light emitting layer on the cathode side.

The organic compound constituting the hole blocking layer includes, for example, those described above as the hole transport material. Examples of the organic compound constituting the hole blocking layer include an aluminum complex such as aluminum(III) bis(2-methyl-8-quinolinato)-4-phenylphenolate (simply referred to as "BAlq"), a triazole derivative, and a phenanthroline derivative such as 2,9-dimethyl-4,7-diphenyl-1,10-phenanthroline (simply referred to as "BCP").

The thickness of the hole blocking layer is preferably from 1 to 500 nm, more preferably from 5 to 200 nm, still more preferably from 10 to 100 nm.

The hole blocking layer may have a single-layer structure composed of one kind of a material described above or two or more kinds of the materials or may have a multilayer structure composed of a plurality of layers having the same composition or different compositions.

—Electron Blocking Layer—

The electron blocking layer is a layer having a function of not allowing an electron transported to the light emitting layer from the cathode side to penetrate to the anode side. In the present invention, the electron blocking layer may be provided as an organic compound layer adjacent to the light emitting layer on the anode side.

Examples of the organic compound constituting the electron blocking layer include those described above as the hole transport material.

The thickness of the electron blocking layer is preferably from 1 to 500 nm, more preferably from 5 to 200 nm, still more preferably from 10 to 100 nm.

The electron blocking layer may have a single-layer structure composed of one kind of a material described above or two or more kinds of the materials or may have a multilayer structure composed of a plurality of layers having the same composition or different compositions.

<Protective Layer>

In the present invention, the entire organic electroluminescence device may be protected by a protective layer.

As for the protective layer, the matters described in JP-A-2008-270736, paragraphs [0169] and [0170] can be applied to the present invention.

<Sealing Container>

The device of the present invention may be entirely sealed using a sealing container.

As for the sealing container, the matters described in JP-A-2008-270736, paragraph [0171] can be applied to the present invention.

[Deposition Method]

In the present invention, the light emitting layer is preferably deposited by heating the material represented by formula (I) for organic electroluminescence devices, where the water content ratio before deposition is from 100 to 1,000 ppm, thereby sublimating and vapor depositing the material.

At the deposition, the material represented by formula (I) for organic electroluminescence devices, where the water content ratio before deposition is from 100 to 1,000 ppm, and the above-described host material are preferably mixed, and the composition of the present invention may also be used. The ratio of the material represented by formula (I) for organic electroluminescence devices, where the water content ratio before deposition is from 100 to 1,000 ppm, contained in the composition of the present invention is preferably from 0.01 to 25 mass %, more preferably from 0.1 to 10 mass %, and most preferably from 0.1 to 5 mass %.

The heating temperature at the vapor deposition is preferably from 200 to 400° C., more preferably from 250 to 320° C.

The heating time at the vapor deposition is preferably from 0.1 to 350 hours, more preferably from 0.1 to 150 hours.

The deposition method of the present invention is advantageous in that a light emitting layer assured of high efficiency, high durability and little color change at the high-temperature driving can be easily produced.

[Drive]

Luminescence of the organic electroluminescence device of the present invention can be obtained by applying a direct-current (if desired, an alternate-current component may be contained) voltage (usually from 2 to 15 volts) or a DC current between the anode and the cathode.

As for the driving method of the organic electroluminescence device of the present invention, the driving methods described, for example, in JP-A-2-148687, JP-A-6-301355, JP-A-5-29080, JP-A-7-134558, JP-A-8-234685, JP-A-8-241047, Japanese Patent 2784615, and U.S. Pat. Nos. 5,828,429 and 6,023,308 can be applied to the present invention.

The light collection efficiency of the luminescence device of the present invention can be enhanced by various known devices. For example, the light collection efficiency and the external quantum efficiency can be enhanced by processing the substrate surface shape (for example, forming a fine uneven pattern), by controlling the refractive index of the substrate, ITO layer or organic layer, or by controlling the film thickness of the substrate, ITO layer or organic layer.

As for the external quantum efficiency of the organic electroluminescence device of the present invention, the external quantum efficiency is preferably from 5 to 100%, more preferably 10 to 100%, still more preferably from 15 to 100%, yet still more preferably from 20 to 30%. For the numerical value of the external quantum efficiency, a maximum value of the external quantum efficiency when the device is driven at 20° C., or a value of the external quantum efficiency in the vicinity of 100 to 2,000 cd/m$^2$ when the device is driven at 20° C., can be used.

The luminescence device of the present invention may be in a so-called top emission system of collecting light from the anode side.

The organic electroluminescence device of the present invention may have a resonator structure. For example, a multilayer mirror composed of a plurality of laminated films differing in the refractive index, a transparent or semi-transparent electrode, a light emitting layer, and a metal electrode are superposed on a transparent substrate. Light generated in the light emitting layer repeats reflection and resonates between the multilayer mirror and the metal electrode by using these as reflectors.

In another preferred embodiment, each of a transparent or semi-transparent electrode and a metal electrode functions as a reflector on a transparent substrate, and light generated in the light emitting layer repeats reflection and resonates therebetween.

In order to form a resonance structure, the effective refractive index of two reflectors and the optical path length determined from the refractive index and thickness of each layer between the reflectors are adjusted to optimal values for obtaining a desired resonance wavelength. The calculating formula in the case of the first embodiment is described in JP-A-9-180883, and the calculating formula in the case of the second embodiment is described in JP-A-2004-127795.

The present invention also relates to a method for manufacturing an organic electroluminescence device, using the material represented by formula (I) for organic electroluminescence devices, that is, a method for manufacturing the device, where the water content ratio is measured before deposition and an organic material having a water content ratio of 100 to 1,000 ppm is selected and used as the material represented by formula (I) for organic electroluminescence devices.

Furthermore, the present invention also relates to a method for reducing the generation ratio of a shorted device, using the material represented by formula (I) for organic electroluminescence devices, that is, a method for reducing the generation ratio of a shorted device, where the water content ratio is measured before deposition and an organic material having a water content ratio of 100 to 1,000 ppm is selected and used as the material represented by formula (I) for organic electroluminescence devices.

(Use of Luminescence Device of the Present Invention)

The luminescence device of the present invention can be suitably used for light emission apparatuses, pixels, display devices, displays, backlights, electrophotography, illumination light sources, recording light sources, exposure light sources, reading light sources, indicators, signboards, interiors, optical communication and the like. In particular, the luminescence device of the present invention is preferably used for a device that is driven in a region of high light emission luminance, such as illumination apparatus and display apparatus.

(Light Emission Apparatus)

The light emission apparatus of the present invention is described below by referring to FIG. 2.

The light emission apparatus of the present invention uses the above-described organic electroluminescence device.

Figure 2:
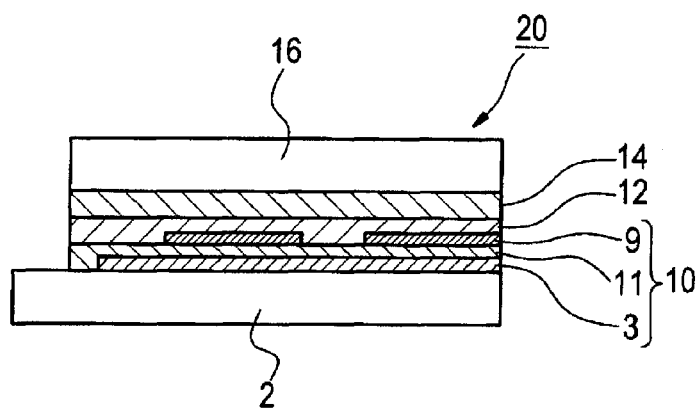
FIG. 2 is a schematic view showing one exemplary example of the light emission apparatus according to the present invention.

FIG. 2 is a cross-sectional view schematically showing one exemplary example of the light emission apparatus of the present invention.

The light emission apparatus 20 of FIG. 2 is composed of a substrate (supporting substrate) 2, an organic electroluminescence device 10, a sealing container 16 and the like.

The organic electroluminescence device 10 is configured by sequentially stacking an anode (first electrode) 3, an organic layer 11 and a cathode (second electrode) 9 on a substrate 2. A protective layer 12 is stacked on the cathode 9, and a sealing container 16 is provided on the protective layer 12 through an adhesion layer 14. Incidentally, a part of electrodes 3 and 9, a partition wall, an insulating layer and the like are omitted.

Here, as for the adhesion layer 14, a photocurable or thermosetting adhesive such as epoxy resin can be used and, for example, a thermosetting adhesive sheet can also be used.

The light emission apparatus of the present invention is not particularly limited in its application and, for example, can be used not only as an illumination apparatus but also a display apparatus of a television set, a personal computer, a cellular phone, an electronic paper and the like.

(Illumination Apparatus)

The illumination apparatus according to an embodiment of the present invention is described below by referring to FIG. 3.

Figure 3:
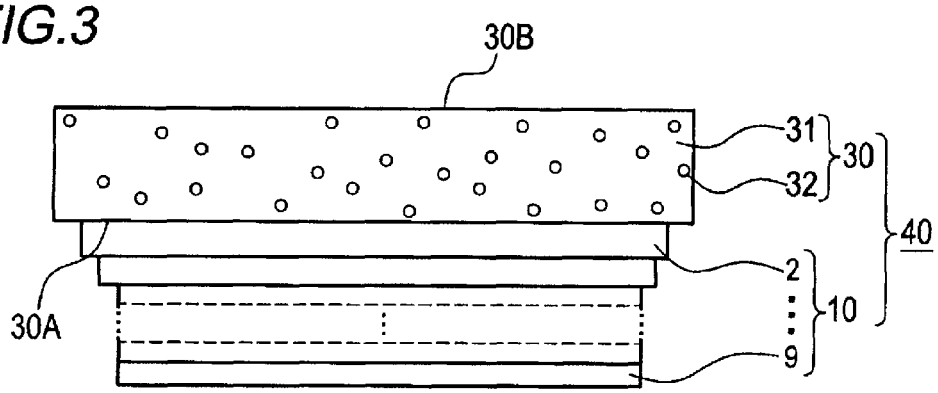
FIG. 3 is a schematic view showing one exemplary example of the illumination apparatus according to the present invention.

FIG. 3 is a cross-sectional view schematically showing one exemplary example of the illumination apparatus according to an embodiment of the present invention.

The illumination apparatus 40 according to an embodiment of the present invention comprises, as shown in FIG. 3, the above-described organic EL device 10 and a light scattering member 30. More specifically, the illumination apparatus 40 is configured such that the substrate 2 of the organic EL device 10 and the light scattering member 30 are put into contact.

The light scattering member 30 is not particularly limited as long as it can scatter light, but in FIG. 3, a member obtained by dispersing fine particles 32 in a transparent substrate 31 is used. Suitable examples of the transparent substrate 31 include a glass substrate, and suitable examples of the fine particles 32 include transparent resin fine particles. As the glass substrate and the transparent resin fine particles, a known product can be used for both. In such an illumination apparatus 40, when light emitted from the organic electroluminescence device 10 is incident on the light incident surface 30A of the scattering member 30, the incident light is scattered by the light scattering member 30 and the scattered light is output as illuminating light from the light output surface 30B.

EXAMPLES

The present invention is described in greater detail below by referring to Examples, but the present invention is not limited to the following specific examples.

Examples 1 to 36

(Manufacture of Organic Electroluminescence Device)

All materials used for the manufacture of the device were purified by sublimation and confirmed to have a purity (area ratio of absorption intensity at 254 nm) of 99.9% or more by high-performance liquid chromatography (Tosoh TSKgel ODS-100Z). A 0.5 mm-thick 2.5 cm-square glass substrate having thereon indium tin oxide (ITO) film (produced by GEOMATEC Corporation, surface resistance: 10 Ω/sq.) was placed in a cleaning vessel and subjected to ultrasonic cleaning in 2-propanol and then to a UV-ozone treatment for 30 minutes. On this transparent anode (ITO film), organic layers were sequentially deposited by the vacuum deposition method to have the device configuration shown in Tables 1 to 36.

The devices shown in Tables 1 to 36 were configured to have the same device configuration except for changing the water content ratio of the objective material before deposition determined when the compound as the objective material was measured by the following method. The water content ratio was adjusted to respective values shown in Tables 1 to 36 by adding water. For example, the "water content ratio" in Table 1 is a value determined when the water content ratio before deposition of Compound 1 as the "objective material" was measured by the following method. In Tables 1 to 36, the sign "<" in the column of water content ratio means an inequality sign and, for example, "<5" indicates that the water content ratio before deposition of the compound as the "objective material" is less than 5 ppm. Also, the device having a device number with the initial "C" indicates that the water content ratio before deposition of the compound as the "objective material" is outside the scope of the present invention.

For example, in Table 1, "Device Configuration: ITO/HTM-1 (60)/HTM-2 (20)/HOST-1+5% Compound 1 (40)/Alq (10)/LiF (1)/Al (100)" indicates that HTM-1 to a film thickness of 60 nm, HTM-2 to a film thickness of 20 nm, 5 mass % of Compound 1 and 95 mass % of HOST-1 to a film thickness of 40 nm, Alq to a film thickness of 10 nm, LiF to a film thickness of 1 nm, and Al to a film thickness of 100 nm were stacked in this order on the ITO film.

Also, in Table 36, "Device Configuration: ITO/HAT-CN (40)/HTM-4 (40)/HOST-2+4.8% Compound 14 (40)/ETM-1 (20)/LiF (1)/HAT-CN (40)/HTM-4 (40)/HOST-2+4.8% Compound 14 (40)/ETM-1 (20)/LiF (1)/Al (100)" indicates that HAT-CN to a film thickness of 40 nm, HTM-4 to a film thickness of 40 nm, 4.8 mass % of Compound 14 and 95.2 mass % of HOST-2 to a film thickness of 40 nm, ETM-1 to a film thickness of 20 nm, LiF to a film thickness of 1 nm, HAT-CN to a film thickness of 40 nm, HTM-4 to a film thickness of 40 nm, 4.8 mass % of Compound 14 and 95.2 mass % of HOST-2 to a film thickness of 40 nm, ETM-1 to a film thickness of 20 nm, LiF to a film thickness of 1 nm, and Al to a film thickness of 100 nm were stacked in this order on the ITO film.

The obtained laminate was put in a glove box purged with an argon gas while keeping it from coming into contact with air and encapsulated using a stainless steel-made sealing can and an ultraviolet-curable adhesive (XNR5516HV, produced by Nagase Ciba) to obtain each device shown in Tables 1 to 36.

(Water Content Ratio of Material for Organic Electroluminescence Device)

The objective material, from 30 minutes to 2 hours before placement in a vapor deposition apparatus, was heated to 140° C. in a water vaporizer (VA-200) by using a Karl Fischer trace moisture meter (CA-200) manufactured by Mitsubishi Chemical Analytech Co., Ltd., and the vaporized water was sent to a titration cell with dry $N_2$ at a flow rate of 250 mL/min, whereby the water content ratio of the material for organic electroluminescence devices was measured.

Incidentally, the objective material was stored in a state of causing no change in the water content ratio between the measurement of the water content ratio and the placement in a vapor deposition apparatus.

(Performance Evaluation of Organic Electroluminescence Device)

Each of the devices obtained was evaluated for the performance.

<Device Evaluation>

(a) External Quantum Efficiency

A direct-current voltage was applied to each device to emit light by using Source Measure Unit 2400 manufactured by Toyo Corp. and its luminance was measured by means of Luminance Meter BM-8 manufactured by Topcon Corporation. The emission spectrum and the emission wavelength were measured using Spectrum Analyzer PMA-11 manufactured by Hamamatsu Photonics K.K. Based on the values obtained, the external quantum efficiency in the vicinity of a luminance of 1,000 cd/m$^2$ was calculated by a luminance conversion method. In each Table, on the basis of the value of the device using a material whose water content ratio is lower than the detection limit (that is, Comparative Devices C1-1 to C36-1 shown at the top of each Table), rating was A when the efficiency was reduced by less than 0.3%, B when reduced by from 0.3% to less than 1.5%, and C when reduced by 1.5% or more.

(b) Driving Durability

A direct-current voltage was applied to each device to continuously emit light with a luminance of 1,000 cd/m$^2$, and the time T spent until the luminance was reduced to 500 cd/m$^2$ was measured. On the basis of the value of the device using a material whose water content ratio is lower than the detection limit (that is, Comparative Devices C1-1 to C36-1 shown at the top of each Table), rating was A when the ratio of the time T to that of the basis device was more than 95%, B when from more than 90% to 95% or less, and C when 90% or less.

(c) Drive Voltage

The voltage when a direct-current voltage was applied to each device to give a luminance of 1,000 cd/m$^2$ was evaluated as the drive voltage. In each Table, on the basis of the value of the device using a material whose water content ratio is lower than the detection limit (that is, Comparative Devices C1-1 to C36-1 shown at the top of each Table), rating was A when the elevated value is from 0 V to less than 0.2 V, B when from 0.2 V to less than 0.5 V, and C when 0.5 V or more.

(d) Number of Shorted Devices

Fifty devices (5 devices×10 times vapor deposition in the same chamber) were prepared under the same conditions, and the number of devices shorted to become non-luminescent when a direct-current voltage of 0 V to 20 V was applied to each device by using Source Measure Unit 2400 manufactured by Toyo Corp., was evaluated by its percentage.

(e) Storage Stability of Device (Presence or Absence of White Clouded Device by Visual Inspection)

Each device was stored in a constant-temperature chamber at 50° C. for 30 days and then evaluated. In the Tables, rating was B when one or more devices whose white clouding could be confirmed with an eye were present, and A when such a device was not present.

TABLE 1

| | | Device Configuration 1: ITO/HTM-1 (60)/HTM-2 (20)/HOST-1 + 5% Compound 1 (40)/Alq (10)/LiF (1)/Al (100) | | | | | | |
|---|---|---|---|---|---|---|---|---|
| Example 1 | Device No. | Water Content Ratio/ppm | Drive Voltage | External Quantum Efficiency | Driving Durability | Number of Shorted Devices | Storage Stability of Device | Remarks |
| Objective Material, Compound 1 | C1-1 | <5 | basis | basis | basis | 8% | B | Comparative Example |
| | C1-2 | 15 | A | A | A | 6% | B | |
| | C1-3 | 30 | A | A | A | 4% | A | |
| | 1-1 | 100 | A | A | A | 2% | A | Invention |
| | 1-2 | 150 | A | A | A | 0% | A | |
| | 1-3 | 380 | A | A | A | 0% | A | |
| | 1-4 | 400 | A | A | A | 0% | A | |
| | 1-5 | 500 | A | A | A | 0% | A | |
| | 1-6 | 750 | A | A | A | 2% | A | |
| | C1-4 | 1950 | C | C | C | 4% | B | Comparative Example |
| | C1-5 | 2500 | C | C | C | 10% | B | |

TABLE 2

| | | Device Configuration 2: ITO/HTM-1 (60)/HTM-2 (20)/HOST-1 + 5% Compound 2 (40)/Alq (10)/LiF (1)/Al (100) | | | | | | |
|---|---|---|---|---|---|---|---|---|
| Example 2 | Device No. | Water Content Ratio/ppm | Drive Voltage | External Quantum Efficiency | Driving Durability | Number of Shorted Devices | Storage Stability of Device | Remarks |
| Objective Material, Compound 2 | C2-1 | <5 | basis | basis | basis | 12% | B | Comparative Example |
| | C2-2 | 20 | A | A | A | 6% | B | |
| | C2-3 | 45 | A | A | A | 4% | B | |
| | 2-1 | 120 | A | A | A | 0% | A | Invention |
| | 2-2 | 150 | A | A | A | 0% | A | |
| | 2-3 | 420 | A | A | A | 0% | A | |
| | 2-4 | 630 | A | A | A | 0% | A | |
| | 2-5 | 800 | A | A | A | 2% | A | |
| | 2-6 | 950 | A | A | A | 2% | A | |
| | C2-4 | 2100 | C | C | C | 4% | B | Comparative Example |
| | C2-5 | 3100 | C | C | C | 10% | B | |

TABLE 3

Device Configuration 3: ITO/HTM-1 (60)/HTM-2 (20)/HOST-1 + 5% Compound 4 (40)/Alq (10)/LiF (1)/Al (100)

| Example 3 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 4 | C3-1 | <5 | basis | basis | basis | 10% | B | Comparative Example |
| | C3-2 | 35 | A | A | A | 6% | B | |
| | C3-3 | 65 | A | A | A | 6% | B | |
| | 3-1 | 110 | A | A | A | 2% | A | Invention |
| | 3-2 | 240 | A | A | A | 0% | A | |
| | 3-3 | 320 | A | A | A | 2% | A | |
| | 3-4 | 480 | A | A | A | 0% | A | |
| | 3-5 | 610 | A | A | A | 0% | A | |
| | 3-6 | 920 | A | A | A | 0% | A | |
| | C3-4 | 1400 | C | C | C | 6% | B | Comparative Example |
| | C3-5 | 2900 | C | C | C | 8% | B | |

TABLE 4

Device Configuration 4: ITO/HTM-1 (60)/HTM-2 (20)/HOST-1 + 5% Compound 5 (40)/Alq (10)/LiF (1)/Al (100)

| Example 4 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 5 | C4-1 | <5 | basis | basis | basis | 12% | B | Comparative Example |
| | C4-2 | 10 | A | A | A | 8% | B | |
| | C4-3 | 20 | A | A | A | 6% | B | |
| | C4-4 | 40 | A | A | A | 6% | B | |
| | C4-5 | 80 | A | A | A | 4% | A | |
| | 4-1 | 120 | A | A | A | 0% | A | Invention |
| | 4-2 | 480 | A | A | A | 2% | A | |
| | 4-3 | 750 | A | A | A | 0% | A | |
| | 4-4 | 950 | A | A | A | 0% | A | |
| | C4-6 | 1200 | C | C | C | 6% | B | Comparative Example |
| | C4-7 | 1800 | C | C | C | 8% | B | |

TABLE 5

Device Configuration 5: ITO/HTM-1 (60)/HTM-2 (20)/HOST-1 + 5% Compound 6 (40)/Alq (10)/LiF (1)/Al (100)

| Example 5 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 6 | C5-1 | <5 | basis | basis | basis | 10% | B | Comparative Example |
| | C5-2 | 60 | A | A | A | 8% | B | |
| | C5-3 | 70 | A | A | A | 6% | B | |
| | C5-4 | 90 | A | A | A | 2% | A | |
| | 5-1 | 130 | A | A | A | 0% | A | Invention |
| | 5-2 | 260 | A | A | A | 0% | A | |
| | 5-3 | 500 | A | A | A | 0% | A | |
| | 5-4 | 830 | A | A | A | 0% | A | |
| | 5-5 | 990 | A | A | A | 0% | A | |
| | C5-5 | 1500 | C | C | C | 4% | B | Comparative Example |
| | C5-6 | 3600 | C | C | C | 8% | B | |

TABLE 6

Device Configuration 6: ITO/HTM-1 (60)/HTM-2 (20)/HOST-1 + 5% Compound 8 (40)/Alq (10)/LiF (1)/Al (100)

| Example 6 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 8 | C6-1 | <5 | basis | basis | basis | 10% | B | Comparative Example |
| | C6-2 | 45 | A | A | A | 8% | B | |
| | C6-3 | 85 | A | A | A | 6% | B | |
| | 6-1 | 120 | A | A | A | 0% | A | Invention |
| | 6-2 | 220 | A | A | A | 2% | A | |
| | 6-3 | 440 | A | A | A | 0% | A | |
| | 6-4 | 630 | A | A | A | 0% | A | |

TABLE 6-continued

Device Configuration 6: ITO/HTM-1 (60)/HTM-2 (20)/HOST-1 + 5% Compound 8 (40)/Alq (10)/LiF (1)/Al (100)

| Example 6 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
|  | 6-5 | 830 | A | A | A | 0% | A |  |
|  | 6-6 | 900 | A | A | A | 2% | A |  |
|  | C6-4 | 1300 | C | C | C | 4% | B | Comparative Example |
|  | C6-5 | 2800 | C | C | C | 12% | B |  |

TABLE 7

Device Configuration 7: ITO/HTM-1 (60)/HTM-2 (20)/HOST-1 + 5% Compound 9 (40)/Alq (10)/LiF (1)/Al (100)

| Example 7 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective | C7-1 | <5 | basis | basis | basis | 8% | B | Comparative Example |
| Material, | C7-2 | 25 | A | A | A | 10% | B |  |
| Compound 9 | C7-3 | 55 | A | A | A | 8% | B |  |
|  | C7-4 | 80 | A | A | A | 4% | A |  |
|  | 7-1 | 160 | A | A | A | 2% | A | Invention |
|  | 7-2 | 300 | A | A | A | 0% | A |  |
|  | 7-3 | 410 | A | A | A | 0% | A |  |
|  | 7-4 | 570 | A | A | A | 0% | A |  |
|  | 7-5 | 850 | A | A | A | 0% | A |  |
|  | C7-5 | 1100 | C | C | C | 6% | B | Comparative Example |
|  | C7-6 | 4200 | C | C | C | 8% | B |  |

TABLE 8

Device Configuration 8: ITO/HTM-1 (60)/HTM-2 (20)/HOST-1 + 5% Compound 10 (40)/Alq (10)/LiF (1)/Al (100)

| Example 8 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective | C8-1 | <5 | basis | basis | basis | 10% | B | Comparative Example |
| Material, | C8-2 | 40 | A | A | A | 8% | B |  |
| Compound 10 | C8-3 | 60 | A | A | A | 6% | B |  |
|  | C8-4 | 90 | A | A | A | 4% | B |  |
|  | 8-1 | 120 | A | A | A | 0% | A | Invention |
|  | 8-2 | 240 | A | A | A | 0% | A |  |
|  | 8-3 | 450 | A | A | A | 0% | A |  |
|  | 8-4 | 610 | A | A | A | 0% | A |  |
|  | 8-5 | 720 | A | A | A | 0% | A |  |
|  | C8-5 | 1500 | C | C | C | 4% | B | Comparative Example |
|  | C8-6 | 2600 | C | C | C | 6% | B |  |

TABLE 9

Device Configuration 9: ITO/HTM-1 (60)/HTM-2 (20)/HOST-1 + 5% Compound 11 (40)/Alq (10)/LiF (1)/Al (100)

| Example 9 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective | C9-1 | <5 | basis | basis | basis | 12% | B | Comparative Example |
| Material, | C9-2 | 30 | A | A | A | 10% | B |  |
| Compound 11 | C9-3 | 50 | A | A | A | 6% | B |  |
|  | C9-4 | 80 | A | A | A | 6% | B |  |
|  | 9-1 | 130 | A | A | A | 0% | A | Invention |
|  | 9-2 | 240 | A | A | A | 2% | A |  |
|  | 9-3 | 460 | A | A | A | 0% | A |  |
|  | 9-4 | 700 | A | A | A | 0% | A |  |

TABLE 9-continued

Device Configuration 9: ITO/HTM-1 (60)/HTM-2 (20)/HOST-1 + 5% Compound 11 (40)/Alq (10)/LiF (1)/Al (100)

| Example 9 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| | 9-5 | 810 | A | A | A | 0% | A | |
| | C9-5 | 1100 | C | C | C | 6% | B | Comparative Example |
| | C9-6 | 2500 | C | C | C | 10% | B | |

TABLE 10

Device Configuration 10: ITO/HTM-1 (60)/HTM-2 (20)/HOST-1 + 5% Compound 12 (40)/Alq (10)/LiF (1)/Al (100)

| Example 10 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 12 | C10-1 | <5 | basis | basis | basis | 10% | B | Comparative Example |
| | C10-2 | 10 | A | A | A | 8% | B | |
| | C10-3 | 40 | A | A | A | 8% | B | |
| | C10-4 | 90 | A | A | A | 6% | B | |
| | C10-5 | 95 | A | A | A | 4% | B | |
| | 10-1 | 230 | A | A | A | 2% | A | Invention |
| | 10-2 | 500 | A | A | A | 0% | A | |
| | 10-3 | 790 | A | A | A | 0% | A | |
| | 10-4 | 940 | A | A | A | 0% | A | |
| | C10-6 | 1600 | C | C | C | 4% | B | Comparative Example |
| | C10-7 | 2500 | C | C | C | 8% | B | |

TABLE 11

Device Configuration 11: ITO/HTM-1 (60)/HTM-2 (20)/HOST-1 + 5% Compound 14 (40)/Alq (10)/LiF (1)/Al (100)

| Example 11 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 14 | C11-1 | <5 | basis | basis | basis | 10% | B | Comparative Example |
| | C11-2 | 25 | A | A | A | 10% | B | |
| | C11-3 | 80 | A | A | A | 6% | B | |
| | 11-1 | 100 | A | A | A | 2% | A | Invention |
| | 11-2 | 190 | A | A | A | 0% | A | |
| | 11-3 | 320 | A | A | A | 0% | A | |
| | 11-4 | 410 | A | A | A | 0% | A | |
| | 11-5 | 660 | A | A | A | 0% | A | |
| | 11-6 | 890 | A | A | A | 0% | A | |
| | C11-4 | 1700 | C | C | C | 4% | B | Comparative Example |
| | C11-5 | 2800 | C | C | C | 8% | B | |

TABLE 12

Device Configuration 12: ITO/HTM-1 (60)/HTM-2 (20)/HOST-1 + 5% Compound 15 (40)/Alq (10)/LiF (1)/Al (100)

| Example 12 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 15 | C12-1 | <5 | basis | basis | basis | 12% | B | Comparative Example |
| | C12-2 | 40 | A | A | A | 10% | B | |
| | C12-3 | 70 | A | A | A | 8% | B | |
| | 12-1 | 120 | A | A | A | 2% | A | Invention |
| | 12-2 | 260 | A | A | A | 0% | A | |
| | 12-3 | 360 | A | A | A | 0% | A | |
| | 12-4 | 480 | A | A | A | 0% | A | |
| | 12-5 | 570 | A | A | A | 0% | A | |
| | 12-6 | 680 | A | A | A | 0% | A | |
| | C12-4 | 1100 | A | A | C | 4% | B | Comparative Example |
| | C12-5 | 3000 | C | C | C | 16% | B | |

TABLE 13

Device Configuration 13: ITO/HTM-1 (60)/HTM-2 (20)/HOST-1 + 5% Compound 17 (40)/Alq (10)/LiF (1)/Al (100)

| Example 13 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 17 | C13-1 | <5 | basis | basis | basis | 8% | B | Comparative Example |
| | C13-2 | 20 | A | A | A | 8% | B | |
| | C13-3 | 60 | A | A | A | 8% | A | |
| | 13-1 | 200 | A | A | A | 2% | A | Invention |
| | 13-2 | 420 | A | A | A | 2% | A | |
| | 13-3 | 510 | A | A | A | 0% | A | |
| | 13-4 | 590 | A | A | A | 0% | A | |
| | 13-5 | 700 | A | A | A | 0% | A | |
| | 13-6 | 850 | A | A | A | 0% | A | |
| | C13-4 | 1400 | A | A | C | 0% | B | Comparative Example |
| | C13-5 | 2900 | C | C | C | 4% | B | |

TABLE 14

Device Configuration 14: ITO/HTM-1 (60)/HTM-2 (20)/HOST-1 + 5% Compound 18 (40)/Alq (10)/LiF (1)/Al (100)

| Example 14 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 18 | C14-1 | <5 | basis | basis | basis | 10% | B | Comparative Example |
| | C14-2 | 15 | A | A | A | 8% | B | |
| | C14-3 | 20 | A | A | A | 8% | B | |
| | C14-4 | 45 | A | A | A | 6% | B | |
| | C14-5 | 70 | A | A | A | 4% | B | |
| | 14-1 | 120 | A | A | A | 0% | A | Invention |
| | 14-2 | 190 | A | A | A | 0% | A | |
| | 14-3 | 500 | A | A | A | 0% | A | |
| | 14-4 | 800 | A | A | A | 0% | A | |
| | C14-6 | 1200 | A | C | C | 2% | A | Comparative Example |
| | C14-7 | 2100 | C | C | C | 8% | B | |

TABLE 15

Device Configuration 15: ITO/HTM-1 (60)/HTM-2 (20)/HOST-1 + 5% Compound 19 (40)/Alq (10)/LiF (1)/Al (100)

| Example 15 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 19 | C15-1 | <5 | basis | basis | basis | 12% | B | Comparative Example |
| | C15-2 | 70 | A | A | A | 10% | B | |
| | C15-3 | 90 | A | A | A | 6% | A | |
| | 15-1 | 140 | A | A | A | 0% | A | Invention |
| | 15-2 | 260 | A | A | A | 2% | A | |
| | 15-3 | 300 | A | A | A | 0% | A | |
| | 15-4 | 490 | A | A | A | 2% | A | |
| | 15-5 | 820 | A | A | A | 0% | A | |
| | 15-6 | 970 | A | A | A | 0% | A | |
| | C15-4 | 1300 | A | C | C | 2% | A | Comparative Example |
| | C15-5 | 2500 | A | C | C | 12% | B | |

TABLE 16

Device Configuration 16: ITO/HTM-1 (60)/HTM-2 (20)/HOST-1 + 5% Compound 20 (40)/Alq (10)/LiF (1)/Al (100)

| Example 16 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 20 | C16-1 | <5 | basis | basis | basis | 10% | B | Comparative Example |
| | C16-2 | 50 | A | A | A | 10% | B | |
| | C16-3 | 80 | A | A | A | 8% | A | |
| | 16-1 | 170 | A | A | A | 2% | A | Invention |
| | 16-2 | 290 | A | A | A | 2% | A | |

TABLE 16-continued

Device Configuration 16: ITO/HTM-1 (60)/HTM-2 (20)/HOST-1 + 5% Compound 20 (40)/Alq (10)/LiF (1)/Al (100)

| Example 16 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| | 16-3 | 390 | A | A | A | 0% | A | |
| | 16-4 | 630 | A | A | A | 0% | A | |
| | 16-5 | 820 | A | A | A | 0% | A | |
| | 16-6 | 990 | A | A | A | 0% | A | |
| | C16-4 | 1100 | A | B | B | 2% | A | Comparative Example |
| | C16-5 | 2400 | B | B | B | 12% | B | |

TABLE 17

Device Configuration 17: ITO/HTM-1 (60)/HTM-2 (20)/HOST-1 + 5% Compound 22 (40)/Alq (10)/LiF (1)/Al (100)

| Example 17 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 22 | C17-1 | <5 | basis | basis | basis | 12% | B | Comparative Example |
| | C17-2 | 20 | A | A | A | 10% | B | |
| | C17-3 | 50 | A | A | A | 10% | B | |
| | C17-4 | 75 | A | A | A | 6% | A | |
| | C17-5 | 85 | A | A | A | 6% | A | |
| | 17-1 | 135 | A | A | A | 0% | A | Invention |
| | 17-2 | 200 | A | A | A | 2% | A | |
| | 17-3 | 460 | A | A | A | 0% | A | |
| | 17-4 | 590 | A | A | A | 0% | A | |
| | C17-6 | 1800 | C | C | C | 2% | A | Comparative Example |
| | C17-7 | 5200 | C | C | C | 12% | B | |

TABLE 18

Device Configuration 18: ITO/HTM-1 (60)/HTM-2 (20)/HOST-1 + 5% Compound 25 (40)/Alq (10)/LiF (1)/Al (100)

| Example 18 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 25 | C18-1 | <5 | basis | basis | basis | 8% | B | Comparative Example |
| | C18-2 | 30 | A | A | A | 8% | B | |
| | C18-3 | 50 | A | A | A | 6% | B | |
| | C18-4 | 85 | A | A | A | 8% | B | |
| | C18-5 | 95 | A | A | A | 4% | B | |
| | 18-1 | 140 | A | A | A | 2% | A | Invention |
| | 18-2 | 310 | A | A | A | 2% | A | |
| | 18-3 | 620 | A | A | A | 2% | A | |
| | 18-4 | 850 | A | A | A | 2% | A | |
| | C18-6 | 1400 | A | C | C | 4% | B | Comparative Example |
| | C18-7 | 2500 | C | C | C | 4% | B | |

TABLE 19

Device Configuration 19: ITO/HTM-1 (60)/HTM-2 (20)/HOST-1 + 5% Compound 29 (40)/Alq (10)/LiF (1)/Al (100)

| Example 19 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 29 | C19-1 | <5 | basis | basis | basis | 6% | B | Comparative Example |
| | C19-2 | 40 | A | A | A | 6% | B | |
| | C19-3 | 50 | A | A | A | 4% | B | |
| | C19-4 | 75 | A | A | A | 6% | B | |
| | C19-5 | 80 | A | A | A | 4% | B | |

TABLE 19-continued

Device Configuration 19: ITO/HTM-1 (60)/HTM-2 (20)/HOST-1 + 5% Compound 29 (40)/Alq (10)/LiF (1)/Al (100)

| Example 19 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| | 19-1 | 160 | A | A | A | 0% | A | Invention |
| | 19-2 | 600 | A | A | A | 0% | A | |
| | 19-3 | 820 | A | A | A | 2% | A | |
| | 19-4 | 940 | A | A | A | 0% | A | |
| | C19-6 | 1700 | A | C | C | 2% | A | Comparative Example |
| | C19-7 | 5000 | C | C | C | 8% | B | |

TABLE 20

Device Configuration 20: ITO/HTM-1 (60)/HTM-2 (20)/HOST-1 + 1% Compound 19 (40)/Alq (10)/LiF (1)/Al (100)

| Example 20 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 19 | C20-1 | <5 | basis | basis | basis | 8% | B | Comparative Example |
| | C20-2 | 20 | A | A | A | 6% | B | |
| | C20-3 | 55 | A | A | A | 6% | B | |
| | C20-4 | 85 | A | A | A | 6% | B | |
| | C20-5 | 95 | A | A | A | 6% | B | |
| | 20-1 | 140 | A | A | A | 0% | A | Invention |
| | 20-2 | 520 | A | A | A | 0% | A | |
| | 20-3 | 740 | A | A | A | 0% | A | |
| | 20-4 | 830 | A | A | A | 0% | A | |
| | C20-6 | 1200 | A | C | C | 2% | A | Comparative Example |
| | C20-7 | 8000 | C | C | C | 10% | B | |

TABLE 21

Device Configuration 21: ITO/HTM-1 (60)/HTM-2 (20)/HOST-1 + 1% Compound 14 (40)/Alq (10)/LiF (1)/Al (100)

| Example 21 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 14 | C21-1 | <5 | basis | basis | basis | 10% | B | Comparative Example |
| | C21-2 | 15 | A | A | A | 8% | B | |
| | C21-3 | 25 | A | A | A | 8% | B | |
| | C21-4 | 45 | A | A | A | 6% | B | |
| | C21-5 | 85 | A | A | A | 4% | A | |
| | 21-1 | 160 | A | A | A | 2% | A | Invention |
| | 21-2 | 270 | A | A | A | 2% | A | |
| | 21-3 | 480 | A | A | A | 0% | A | |
| | 21-4 | 690 | A | A | A | 0% | A | |
| | C21-6 | 1100 | A | A | C | 8% | B | Comparative Example |
| | C21-7 | 2800 | C | C | C | 10% | B | |

TABLE 22

Device Configuration 22: ITO/HTM-1 (60)/HTM-2 (20)/HOST-1 + 2% Compound 14 (40)/Alq (10)/LiF (1)/Al (100)

| Example 22 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 14 | C22-1 | <5 | basis | basis | basis | 6% | B | Comparative Example |
| | C22-2 | 15 | A | A | A | 8% | B | |
| | C22-3 | 40 | A | A | A | 8% | B | |
| | C22-4 | 60 | A | A | A | 6% | B | |
| | C22-5 | 85 | A | A | A | 6% | A | |

TABLE 22-continued

Device Configuration 22: ITO/HTM-1 (60)/HTM-2 (20)/HOST-1 + 2% Compound 14 (40)/Alq (10)/LiF (1)/Al (100)

| Example 22 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| | 22-1 | 120 | A | A | A | 2% | A | Invention |
| | 22-2 | 370 | A | A | A | 2% | A | |
| | 22-3 | 580 | A | A | A | 0% | A | |
| | 22-4 | 880 | A | A | A | 2% | A | |
| | C22-6 | 1750 | A | A | C | 8% | A | Comparative Example |
| | C22-7 | 2600 | C | C | C | 8% | B | |

TABLE 23

Device Configuration 23: ITO/HTM-1 (60)/HTM-2 (20)/HOST-1 + 7% Compound 14 (40)/Alq (10)/LiF (1)/Al (100)

| Example 23 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 14 | C23-1 | <5 | basis | basis | basis | 10% | B | Comparative Example |
| | C23-2 | 20 | A | A | A | 8% | B | |
| | C23-3 | 30 | A | A | A | 8% | B | |
| | C23-4 | 65 | A | A | A | 10% | B | |
| | C23-5 | 80 | A | A | A | 4% | A | |
| | 23-1 | 140 | A | A | A | 2% | A | Invention |
| | 23-2 | 380 | A | A | A | 2% | A | |
| | 23-3 | 720 | A | A | A | 0% | A | |
| | 23-4 | 890 | A | A | A | 2% | A | |
| | C23-6 | 1100 | A | A | C | 6% | A | Comparative Example |
| | C23-7 | 2700 | C | C | C | 8% | B | |

TABLE 24

Device Configuration 24: ITO/HTM-1 (60)/HTM-2 (20)/HOST-2 + 5% Compound 2 (40)/Alq (10)/LiF (1)/Al (100)

| Example 24 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 2 | C24-1 | <5 | basis | basis | basis | 12% | B | Comparative Example |
| | C24-2 | 15 | A | A | A | 6% | B | |
| | C24-3 | 30 | A | A | A | 6% | B | |
| | C24-4 | 50 | A | A | A | 6% | B | |
| | C24-5 | 85 | A | A | A | 4% | B | |
| | 24-1 | 160 | A | A | A | 0% | A | Invention |
| | 24-2 | 450 | A | A | A | 0% | A | |
| | 24-3 | 660 | A | A | A | 0% | A | |
| | 24-4 | 790 | A | A | A | 2% | A | |
| | C24-6 | 1500 | A | C | C | 6% | B | Comparative Example |
| | C24-7 | 6000 | C | C | C | 10% | B | |

TABLE 25

Device Configuration 25: ITO/HTM-1 (60)/HTM-2 (20)/HOST-2 + 5% Compound 14 (40)/Alq (10)/LiF (1)/Al (100)

| Example 25 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 14 | C25-1 | <5 | basis | basis | basis | 10% | B | Comparative Example |
| | C25-2 | 25 | A | A | A | 8% | B | |
| | C25-3 | 60 | A | A | A | 6% | B | |
| | C25-4 | 95 | A | A | A | 6% | B | |
| | 25-1 | 100 | A | A | A | 0% | A | Invention |
| | 25-2 | 150 | A | A | A | 2% | A | |

TABLE 25-continued

Device Configuration 25: ITO/HTM-1 (60)/HTM-2 (20)/HOST-2 + 5% Compound 14 (40)/Alq (10)/LiF (1)/Al (100)

| Example 25 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| | 25-3 | 450 | A | A | A | 0% | A | |
| | 25-4 | 850 | A | A | A | 0% | A | |
| | 25-5 | 900 | A | A | A | 0% | A | |
| | C25-5 | 1650 | A | A | C | 6% | B | Comparative Example |
| | C25-6 | 3100 | C | C | C | 8% | B | |

TABLE 26

Device Configuration 26: ITO/HTM-1 (60)/HTM-2 (20)/HOST-3 + 5% Compound 4 (40)/Alq (10)/LiF (1)/Al (100)

| Example 26 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective | C26-1 | <5 | basis | basis | basis | 6% | B | Comparative Example |
| Material, | C26-2 | 40 | A | A | A | 8% | B | |
| Compound 4 | C26-3 | 80 | A | A | A | 8% | B | |
| | C26-4 | 85 | A | A | A | 6% | B | |
| | 26-1 | 170 | A | A | A | 2% | A | Invention |
| | 26-2 | 260 | A | A | A | 2% | A | |
| | 26-3 | 480 | A | A | A | 0% | A | |
| | 26-4 | 560 | A | A | A | 2% | A | |
| | 26-5 | 790 | A | A | A | 0% | A | |
| | C26-5 | 1400 | A | A | C | 6% | B | Comparative Example |
| | C26-6 | 2400 | C | C | C | 6% | B | |

TABLE 27

Device Configuration 27: ITO/HTM-1 (60)/HTM-2 (20)/HOST-3 + 5% Compound 14 (40)/Alq (10)/LiF (1)/Al (100)

| Example 27 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective | C27-1 | <5 | basis | basis | basis | 8% | B | Comparative Example |
| Material, | C27-2 | 15 | A | A | A | 10% | B | |
| Compound 14 | C27-3 | 40 | A | A | A | 6% | B | |
| | C27-4 | 65 | A | A | A | 8% | B | |
| | 27-1 | 150 | A | A | A | 4% | A | Invention |
| | 27-2 | 350 | A | A | A | 2% | A | |
| | 27-3 | 650 | A | A | A | 0% | A | |
| | 27-4 | 700 | A | A | A | 0% | A | |
| | 27-5 | 900 | A | A | A | 0% | A | |
| | C27-5 | 1300 | C | C | C | 4% | B | Comparative Example |
| | C27-6 | 2000 | C | C | C | 6% | B | |

TABLE 28

Device Configuration 28: ITO/HTM-1 (60)/HTM-2 (20)/HOST-4 + 5% Compound 9 (40)/Alq (10)/LiF (1)/Al (100)

| Example 28 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective | C28-1 | <5 | basis | basis | basis | 6% | B | Comparative Example |
| Material, | C28-2 | 10 | A | A | A | 4% | B | |
| Compound 9 | C28-3 | 30 | A | A | A | 8% | B | |
| | C28-4 | 70 | A | A | A | 10% | B | |
| | 28-1 | 140 | A | A | A | 2% | A | Invention |
| | 28-2 | 270 | A | A | A | 0% | A | |
| | 28-3 | 510 | A | A | A | 0% | A | |

TABLE 28-continued

Device Configuration 28: ITO/HTM-1 (60)/HTM-2 (20)/HOST-4 + 5% Compound 9 (40)/Alq (10)/LiF (1)/Al (100)

| Example 28 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| | 28-4 | 610 | A | A | A | 4% | A | |
| | 28-5 | 800 | A | A | A | 2% | A | |
| | C28-5 | 1300 | A | A | C | 6% | B | Comparative Example |
| | C28-6 | 2200 | C | C | C | 10% | B | |

TABLE 29

Device Configuration 29: ITO/HTM-1 (60)/HTM-2 (20)/HOST-4 + 5% Compound 14 (40)/Alq (10)/LiF (1)/Al (100)

| Example 29 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 14 | C29-1 | <5 | basis | basis | basis | 8% | B | Comparative Example |
| | C29-2 | 20 | A | A | A | 6% | B | |
| | C29-3 | 40 | A | A | A | 4% | B | |
| | C29-4 | 85 | A | A | A | 4% | B | |
| | 29-1 | 150 | A | A | A | 2% | A | Invention |
| | 29-2 | 320 | A | A | A | 0% | A | |
| | 29-3 | 540 | A | A | A | 0% | A | |
| | 29-4 | 690 | A | A | A | 0% | A | |
| | 29-5 | 850 | A | A | A | 0% | A | |
| | C29-5 | 2100 | A | A | C | 2% | B | Comparative Example |
| | C29-6 | 4200 | C | C | C | 6% | B | |

TABLE 30

Device Configuration 30: ITO/CuPc (10)/NPD (40)/HOST-1 + 5% Compound 7 (40)/Alq (10)/LiF (1)/Al (100)

| Example 30 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 7 | C30-1 | <5 | basis | basis | basis | 10% | B | Comparative Example |
| | C30-2 | 15 | A | A | A | 8% | B | |
| | C30-3 | 30 | A | A | A | 8% | B | |
| | C30-4 | 50 | A | A | A | 6% | B | |
| | 30-1 | 110 | A | A | A | 2% | A | Invention |
| | 30-2 | 240 | A | A | A | 0% | A | |
| | 30-3 | 320 | A | A | A | 0% | A | |
| | 30-4 | 440 | A | A | A | 0% | A | |
| | 30-5 | 870 | A | A | A | 2% | A | |
| | C30-5 | 1400 | A | A | C | 6% | B | Comparative Example |
| | C30-6 | 3100 | C | C | C | 10% | B | |

TABLE 31

Device Configuration 31: ITO/HTM-3 (3)/HTM-2 (42)/HOST-2 + 10% Compound 2 (20)/ETM-1 (30)/LiF (0.5)/Al (100)

| Example 31 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective Material, Compound 2 | C31-1 | <5 | basis | basis | basis | 10% | B | Comparative Example |
| | C31-2 | 15 | A | A | A | 8% | B | |
| | C31-3 | 40 | A | A | A | 6% | B | |
| | C31-4 | 60 | A | A | A | 6% | B | |
| | 31-1 | 200 | A | A | A | 2% | A | Invention |
| | 31-2 | 280 | A | A | A | 0% | A | |
| | 31-3 | 370 | A | A | A | 0% | A | |

TABLE 31-continued

Device Configuration 31: ITO/HTM-3 (3)/HTM-2 (42)/HOST-2 + 10% Compound 2 (20)/ETM-1 (30)/LiF (0.5)/Al (100)

| Example 31 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| | 31-4 | 530 | A | A | A | 0% | A | |
| | 31-5 | 860 | A | A | A | 0% | A | |
| | C31-5 | 1500 | A | C | C | 4% | B | Comparative Example |
| | C31-6 | 2700 | C | C | C | 8% | B | |

TABLE 32

Device Configuration 32: ITO/HTM-3 (3)/HTM-2 (42)/HOST-2 + 10% Compound 5 (20)/ETM-1 (30)/LiF (0.5)/Al (100)

| Example 32 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective | C32-1 | <5 | basis | basis | basis | 8% | B | Comparative Example |
| Material, | C32-2 | 20 | A | A | A | 8% | B | |
| Compound 5 | C32-3 | 80 | A | A | A | 6% | B | |
| | C32-4 | 95 | A | A | A | 4% | B | |
| | 32-1 | 160 | A | A | A | 2% | A | Invention |
| | 32-2 | 510 | A | A | A | 0% | A | |
| | 32-3 | 740 | A | A | A | 0% | A | |
| | 32-4 | 880 | A | A | A | 0% | A | |
| | 32-5 | 930 | A | A | A | 2% | A | |
| | C32-5 | 1400 | A | C | C | 4% | B | Comparative Example |
| | C32-6 | 2400 | C | C | C | 10% | B | |

TABLE 33

Device Configuration 33: ITO/HTM-3 (3)/HTM-2 (42)/HOST-2 + 10% Compound 11 (20)/ETM-1 (30)/LiF (0.5)/Al (100)

| Example 33 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective | C33-1 | <5 | basis | basis | basis | 6% | B | Comparative Example |
| Material, | C33-2 | 25 | A | A | A | 8% | B | |
| Compound 11 | C33-3 | 35 | A | A | A | 8% | B | |
| | C33-4 | 50 | A | A | A | 6% | B | |
| | C33-5 | 70 | A | A | A | 6% | B | |
| | 33-1 | 140 | A | A | A | 2% | A | Invention |
| | 33-2 | 330 | A | A | A | 2% | A | |
| | 33-3 | 620 | A | A | A | 0% | A | |
| | 33-4 | 950 | A | A | A | 0% | A | |
| | C33-6 | 1200 | A | A | C | 2% | B | Comparative Example |
| | C33-7 | 3600 | C | C | C | 12% | B | |

TABLE 34

Device Configuration 34: ITO/HTM-3 (3)/HTM-2 (42)/HOST-2 + 10% Compound 14 (20)/ETM-1 (30)/LiF (0.5)/Al (100)

| Example 34 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective | C34-1 | <5 | basis | basis | basis | 8% | B | Comparative Example |
| Material, | C34-2 | 15 | A | A | A | 8% | B | |
| Compound 14 | C34-3 | 35 | A | A | A | 6% | B | |
| | C34-4 | 60 | A | A | A | 8% | B | |
| | C34-5 | 80 | A | A | A | 6% | B | |
| | 34-1 | 150 | A | A | A | 0% | A | Invention |
| | 34-2 | 260 | A | A | A | 0% | A | |

TABLE 34-continued

Device Configuration 34: ITO/HTM-3 (3)/HTM-2 (42)/HOST-2 + 10% Compound 14 (20)/ETM-1 (30)/LiF (0.5)/Al (100)

| Example 34 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| | 34-3 | 410 | A | A | A | 0% | A | |
| | 34-4 | 780 | A | A | A | 0% | A | |
| | C34-6 | 1400 | C | C | C | 4% | B | Comparative Example |
| | C34-7 | 3500 | C | C | C | 12% | B | |

TABLE 35

Device Configuration 35: ITO/HTM-3 (3)/HTM-2 (42)/HOST-2 + 10% Compound 29 (20)/ETM-1 (30)/LiF (0.5)/Al (100)

| Example 35 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective | C35-1 | <5 | basis | basis | basis | 6% | B | Comparative Example |
| Material, | C35-2 | 10 | A | A | A | 6% | B | |
| Compound 29 | C35-3 | 60 | A | A | A | 4% | B | |
| | C35-4 | 80 | A | A | A | 4% | B | |
| | 35-1 | 120 | A | A | A | 0% | B | Invention |
| | 35-2 | 330 | A | A | A | 2% | A | |
| | 35-3 | 670 | A | A | A | 0% | A | |
| | 35-4 | 920 | A | A | A | 0% | A | |
| | 35-5 | 980 | A | A | A | 2% | A | |
| | C35-5 | 1100 | A | A | C | 6% | B | Comparative Example |
| | C35-6 | 2500 | C | C | C | 10% | B | |

TABLE 36

Device Configuration 36: ITO/HAT-CN (40)/HTM-4 (40)/HOST-2 + 4.8% Compound 14 (40)/ETM-1 (20)/LiF (1)/HAT-CN (40)/HTM-4 (40)/HOST-2 + 4.8% Compound 14 (40)/ETM-1 (20)/LiF(1)/Al (100)

| Example 36 | Device No. | Water Content Ratio/ppm | Drive Voltage | External Quantum Efficiency | Driving Durability | Number of Shorted Devices | Storage Stability of Device | Remarks |
|---|---|---|---|---|---|---|---|---|
| Objective | C36-1 | <5 | basis | basis | basis | 10% | B | Comparative Example |
| Material, | C36-2 | 20 | A | A | A | 6% | B | |
| Compound 14 | C36-3 | 30 | A | A | A | 4% | B | |
| | C36-4 | 75 | A | A | A | 4% | B | |
| | 36-1 | 230 | A | A | A | 0% | A | Invention |
| | 36-2 | 480 | A | A | A | 0% | A | |
| | 36-3 | 610 | A | A | A | 0% | A | |
| | 36-4 | 790 | A | A | A | 0% | A | |
| | 36-5 | 890 | A | A | A | 0% | A | |
| | C36-5 | 1700 | A | C | C | 2% | B | Comparative Example |
| | C36-6 | 4200 | C | C | C | 10% | B | |

As seen from the results in Tables 1 to 36, the device of the present invention using a material whose water content ratio before deposition is from 100 to 1,000 ppm is excellent in the drive voltage, external quantum efficiency and driving durability compared with the devices of Comparative Examples using a material whose water content ratio before deposition is higher than the range above, and at the same time, decrease in the number of shorted devices and increase in the yield can be achieved without deteriorating the device characteristics compared with the devices of Comparative Examples using a material whose water content ratio before deposition is lower than the range above. Particularly, in the case of the devices of Comparative Examples using a material whose water content ratio before deposition is less than 100 ppm, the number of shorted devices was increased. Furthermore, the devices of Comparative Examples using a material whose water content ratio before deposition exceeds 1,000 ppm are inferior in the external quantum efficiency and driving durability to the device of the present invention. It is also seen that in the device of the present invention, white clouding presumed to be attributable to fine crystallization of a device material can be suppressed and a device with excellent storage stability can be provided.

The device of the present invention is suited for a light emission apparatus, a display apparatus and an illumination apparatus.

Structures of the compounds used in Examples and Comparative Examples are shown below. Incidentally, the compound used as the objective material was selected from the compounds illustrated above as Compounds 1 to 34.

HTM-1
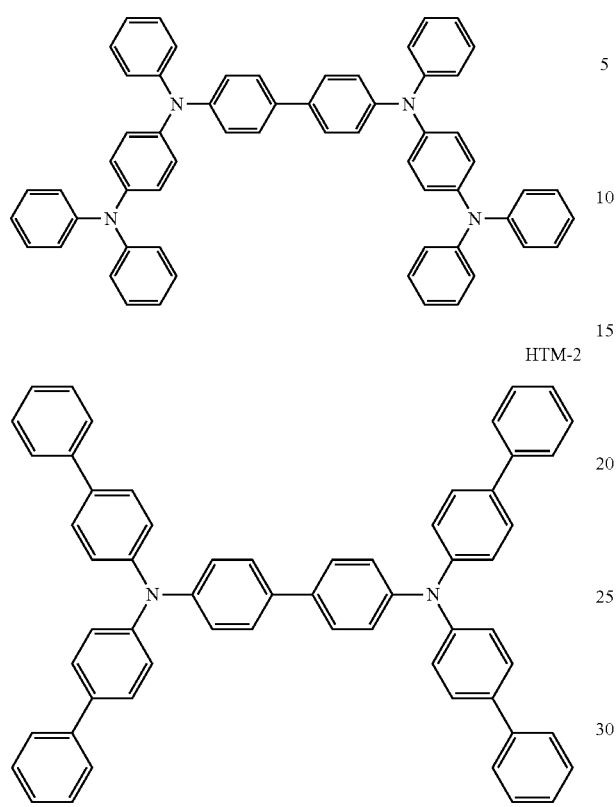
HTM-2
HTM-3
HTM-4
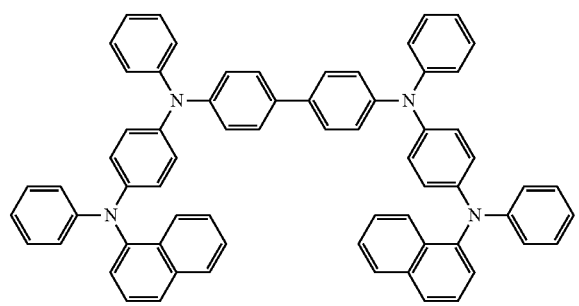
HOST-1
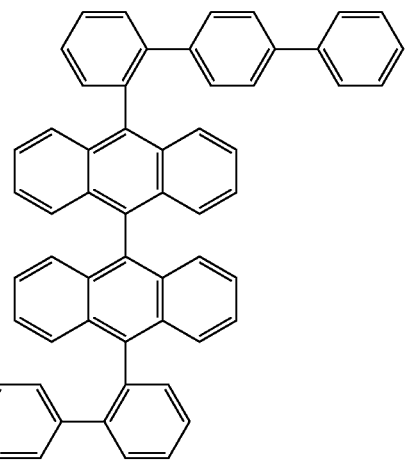
HOST-2
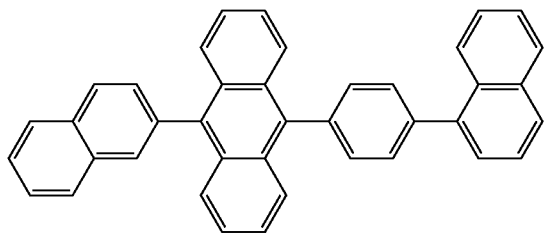
HOST-3
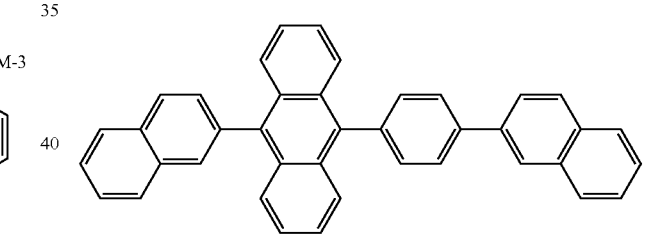
ETM-1
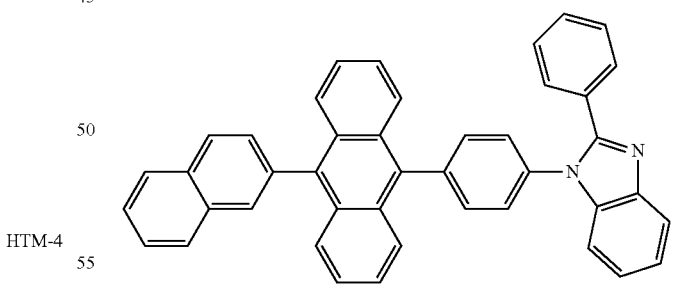
HOST-4
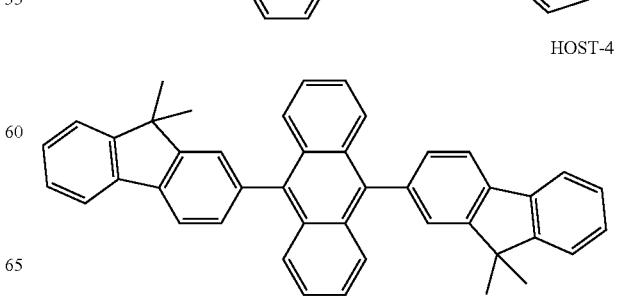

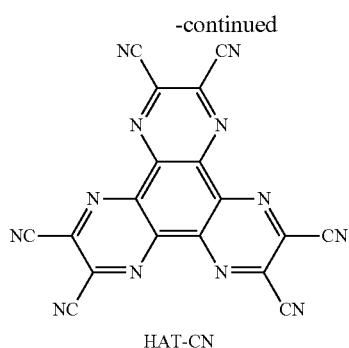
HAT-CN

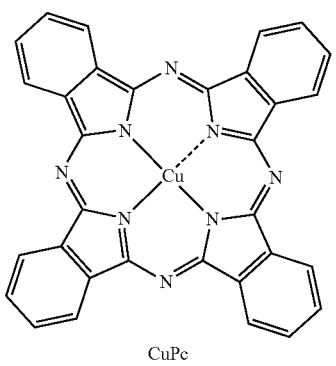
CuPc

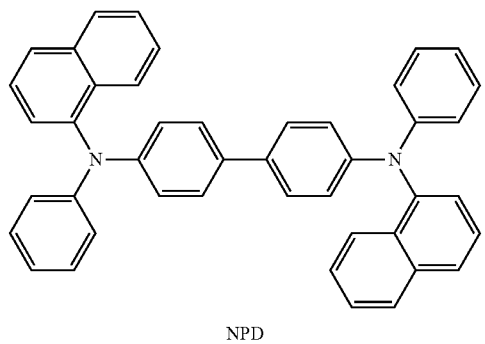
NPD

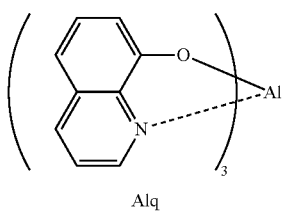
Alq

According to the present invention, a material for organic electroluminescence devices, which enables manufacturing an organic electroluminescence device imparted with excellent luminescence characteristics, reduced in the number of shorted devices and excelled also in the storage stability, and an organic electroluminescence device using the material for organic electroluminescence devices, can be provided.

The organic electroluminescence device of the present invention is excellent in the drive voltage, external quantum efficiency and driving durability and at the same time, can reduce the number of shorted devices without deteriorating the device characteristics. This device is also excelled in the storage stability.

This application is based on Japanese patent application JP 2010-100397, filed on Apr. 23, 2010, the entire content of which is hereby incorporated by reference, the same as if set forth at length.

What is claimed is:

1. A method for manufacturing an organic electroluminescence device, comprising:
   (i) obtaining a material component having a water content from 100 to 1,000 ppm as measured by the Karl Fischer's method, the material component further comprising a compound of formula (I):

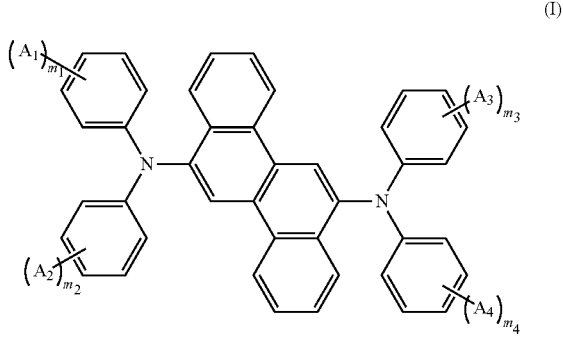

(I)

wherein each of $A_1$ to $A_4$ independently represents an alkyl group, a cycloalkyl group, an aryl group, a heteroaryl group, a cyano group, a fluorine atom, an alkoxy group, a phenoxy group or an amino group; and
each of $m_1$ to $m_4$ independently represents an integer of 0 to 5, and when $m_1$ to $m_4$ is 2 or more, a plurality of $A_1$'s, a plurality of $A_2$'s, a plurality of $A_3$'s and a plurality of $A_4$'s may be the same as or different respectively, and a plurality of $A_1$'s, a plurality of $A_2$'s, a plurality of $A_3$'s and a plurality of $A_4$'s may combine with each other to form a ring respectively;
   (ii) heating the material component to thereby sublimate the material component; and
   (iii) depositing the sublimated material component into at least one organic layer of an organic electroluminescence device, wherein the at least one organic layer is disposed between a pair of electrodes.

2. A light emission apparatus, comprising an organic electroluminescence device formed according to the method of claim 1.

3. A display apparatus, comprising an organic electroluminescence device formed according to the method of claim 1.

4. An illumination apparatus, comprising an organic electroluminescence device formed according to the method of claim 1.

5. The method according to claim 1 wherein said heating step is performed at a temperature ranging from 200° C. to 400° C.

6. The method of claim 1, wherein each of $A_1$ to $A_4$ independently represents a methyl group, an ethyl group, an n-propyl group, an isopropyl group, an n-butyl group, an isobutyl group, a sec-butyl group, a tert-butyl group or a neopentyl group.

7. The method of claim 1, wherein each of $m_1$ to $m_4$ is 1.

8. The method of claim 1, wherein each of $A_1$ to $A_4$ is independently a methyl group or an isopropyl group.

9. The method of claim 1, wherein the compound represented by formula (I) is the following compound

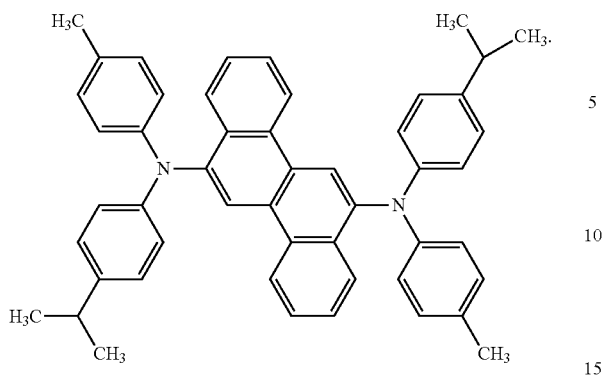
10. An organic electroluminescence device formed according to the method of claim 1.
* * * * *